United States Patent
Eichler et al.

(10) Patent No.: US 10,181,700 B2
(45) Date of Patent: Jan. 15, 2019

(54) SEMICONDUCTOR LASER HAVING A RIDGE STRUCTURE WIDENED ON ONE SIDE

(71) Applicant: OSRAM Opto Semiconductors GmbH, Regensburg (DE)

(72) Inventors: Christoph Eichler, Tegernheim (DE); Jens Müller, Regensburg (DE); Fabian Kopp, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/029,372

(22) PCT Filed: Oct. 14, 2014

(86) PCT No.: PCT/EP2014/072004
§ 371 (c)(1),
(2) Date: Apr. 14, 2016

(87) PCT Pub. No.: WO2015/055644
PCT Pub. Date: Apr. 23, 2015

(65) Prior Publication Data
US 2016/0268775 A1    Sep. 15, 2016

(30) Foreign Application Priority Data

Oct. 14, 2013    (DE) .................. 10 2013 220 641

(51) Int. Cl.
*H01S 5/22*    (2006.01)
*H01S 5/02*    (2006.01)
(Continued)

(52) U.S. Cl.
CPC .............. *H01S 5/22* (2013.01); *H01S 5/0202* (2013.01); *H01S 5/1014* (2013.01); *H01S 5/028* (2013.01); *H01S 5/1017* (2013.01); *H01S 5/4031* (2013.01)

(58) Field of Classification Search
CPC ........ H01S 5/22; H01S 5/0202; H01S 5/1014; H01S 5/1017; H01S 5/4031; H01S 5/028
See application file for complete search history.

(56) References Cited

U.S. PATENT DOCUMENTS 4,730,327 A * 3/1988 Gordon ................ H01S 5/4031
372/108
6,414,976 B1   7/2002 Hirata
(Continued)

FOREIGN PATENT DOCUMENTS

DE   10 2009 058 345 A1   6/2011
DE   10 2011 100 175 A1   11/2012
(Continued)

OTHER PUBLICATIONS

"Ridge Waveguide Ridge Mirror Laser Diode", IBM Technical Disclosure Bulletin, International Business Machines Corp. (Thornwood), US, vol. 37, No. 3, Mar. 1, 1994 (Mar. 1, 1994), p. 41.*

(Continued)

*Primary Examiner* — Xinning Niu
(74) *Attorney, Agent, or Firm* — DLA Piper LLP (US)

(57) ABSTRACT

A semiconductor laser includes a main body and a ridge structure arranged on the main body, the ridge structure being oriented along a longitudinal axis above an active zone, wherein the ridge structure has a first width, the ridge structure has two opposite end faces along the longitudinal axis, adjacent to at least one end face, the ridge structure has an end section arranged on one side with respect to a center axis of the ridge structure such that the ridge structure is widened on one side adjacent to the end face, and on an opposite side of the ridge structure relative to the end section a fracture trench is arranged adjacent to the end face and at a distance from the ridge structure in a surface of the main body.

16 Claims, 19 Drawing Sheets

(51) Int. Cl.
*H01S 5/10* (2006.01)
*H01S 5/028* (2006.01)
*H01S 5/40* (2006.01)

(56) References Cited

U.S. PATENT DOCUMENTS

| | | | |
|---|---|---|---|
| 2001/0013608 A1 | 8/2001 | Kobayashi et al. | |
| 2004/0184501 A1* | 9/2004 | Takayama | G11B 7/123 |
| | | | 372/46.011 |
| 2009/0262771 A1* | 10/2009 | Inoue | B82Y 20/00 |
| | | | 372/45.01 |

FOREIGN PATENT DOCUMENTS

| | | |
|---|---|---|
| DE | 10 2011 054 954 A1 | 5/2013 |
| JP | 2006-093614 A | 4/2006 |

OTHER PUBLICATIONS

"Ridge Waveguide Ridge Mirror Laser Diode," IBM Technical Disclosure Bulletin, International Business Machines Corporation (Thornwood), US, vol. 37, No. 3, Mar. 1, 1994, p. 41.
First Office Action dated May 3, 2018 from corresponding Chinese Application No. 201480056614.X in English.

* cited by examiner

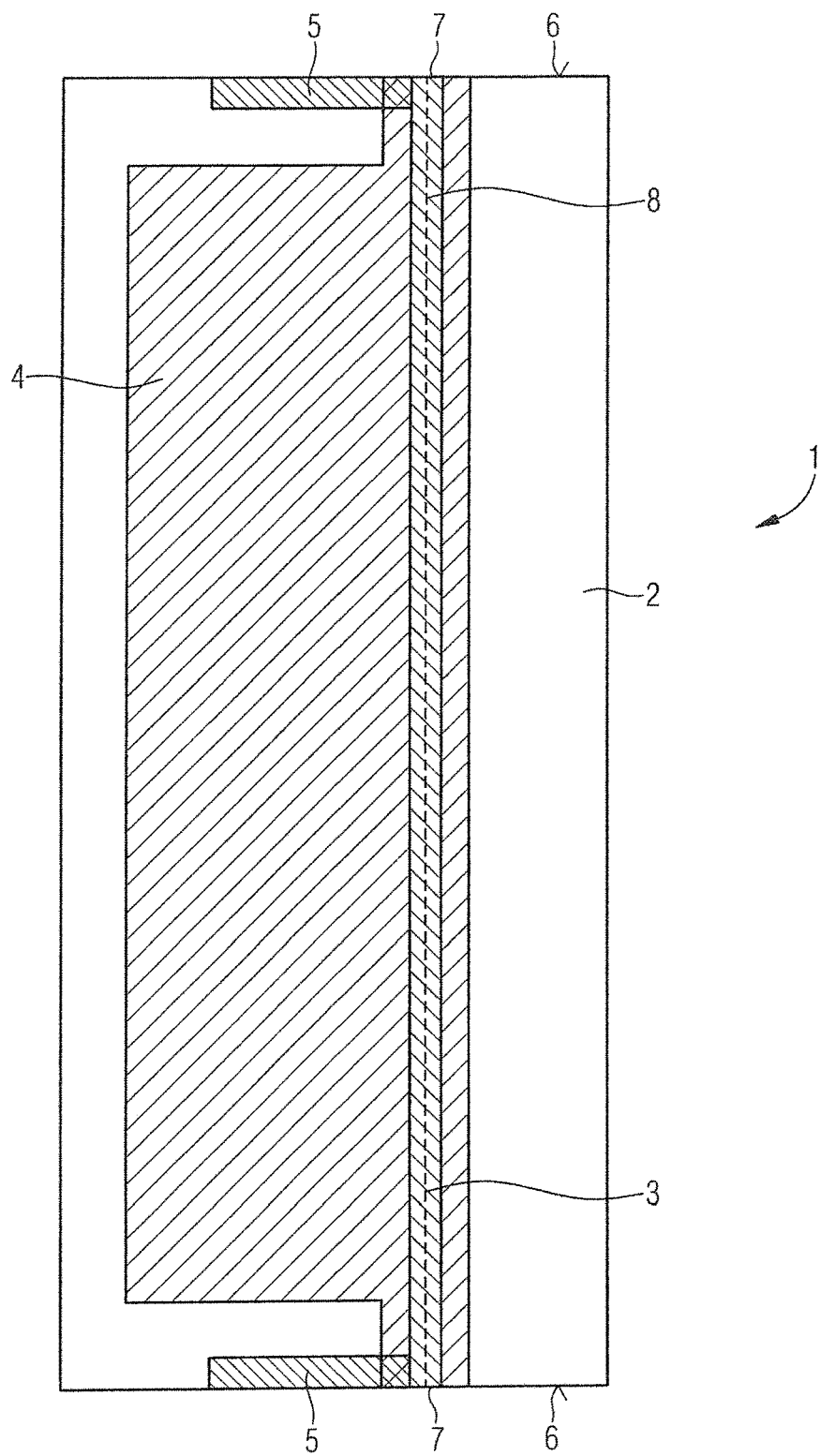

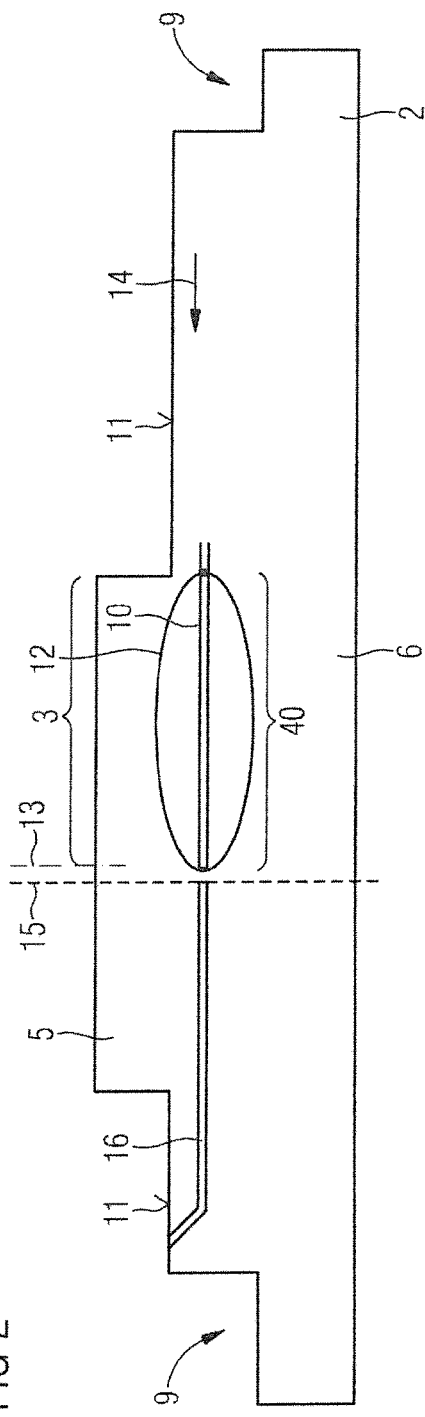
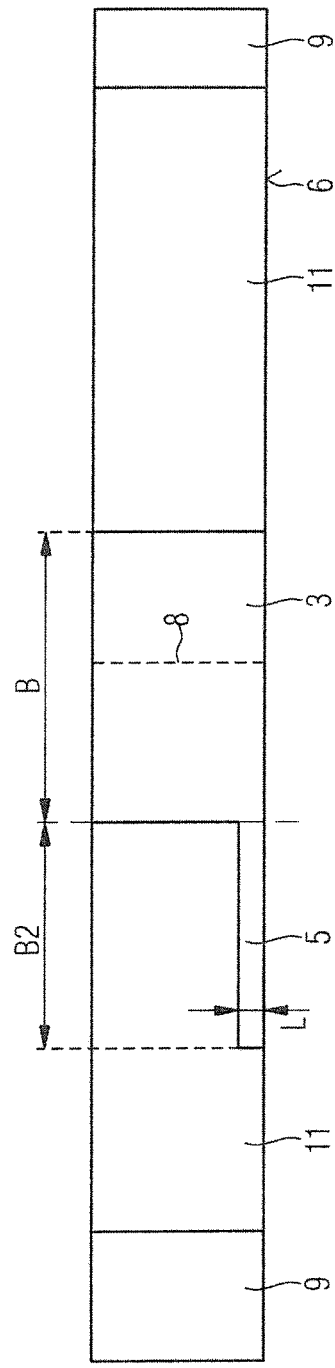

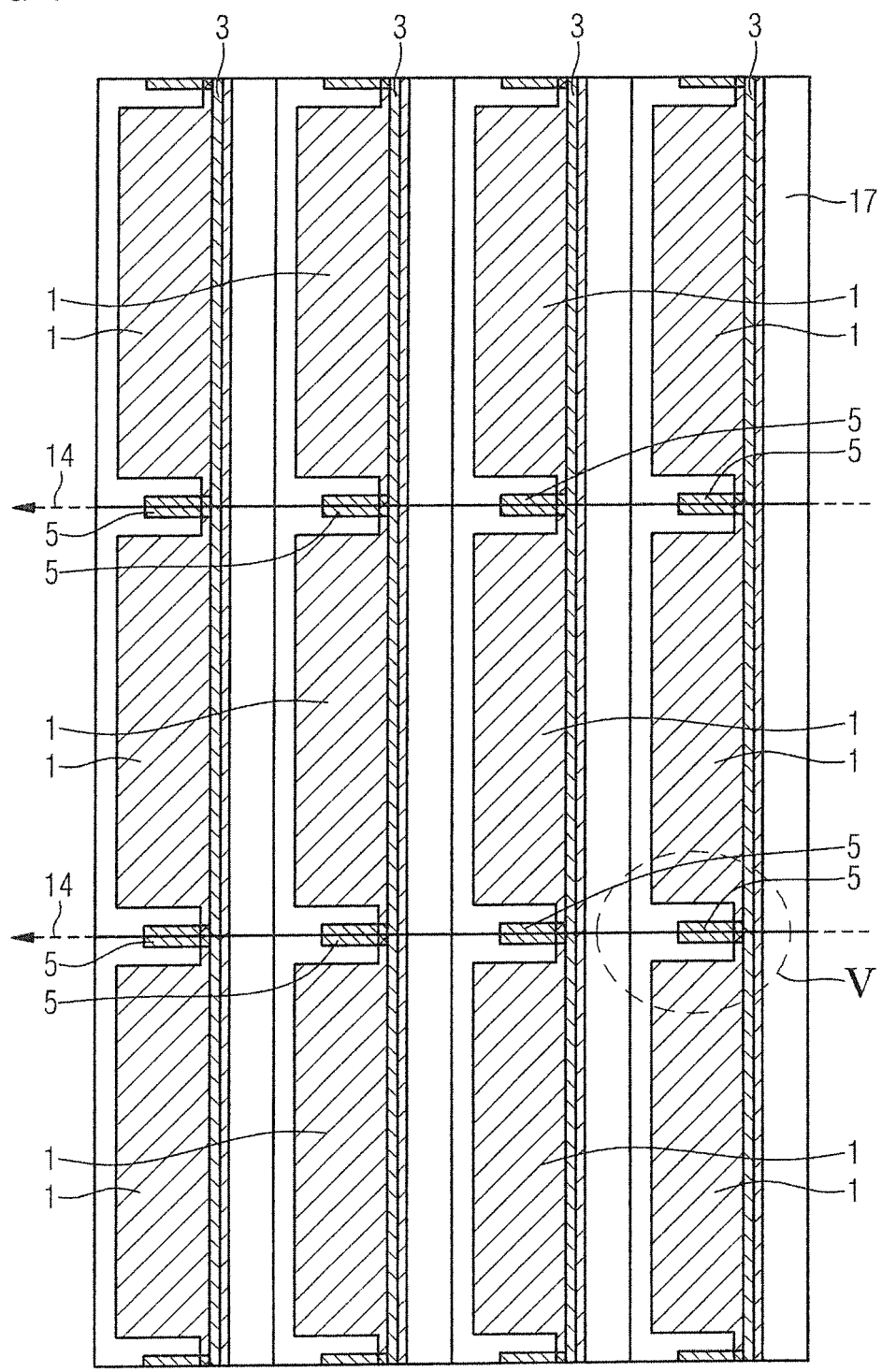

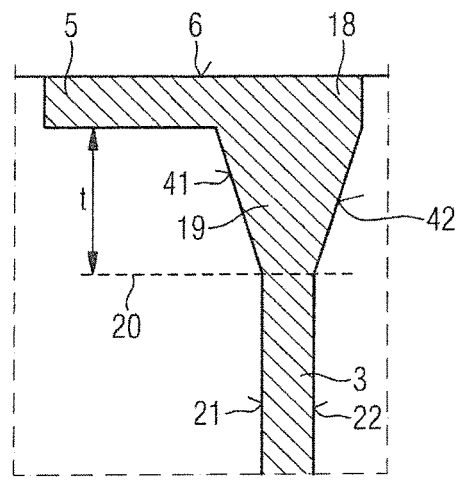
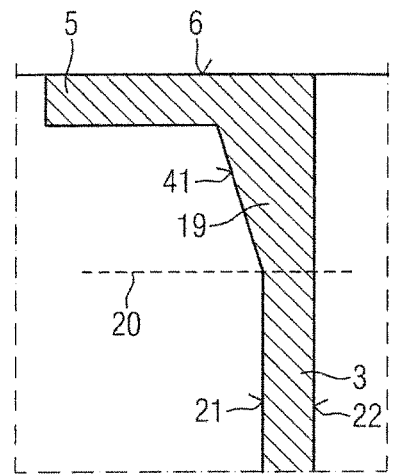
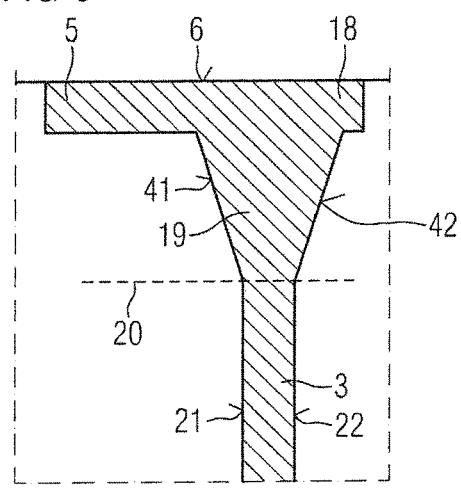
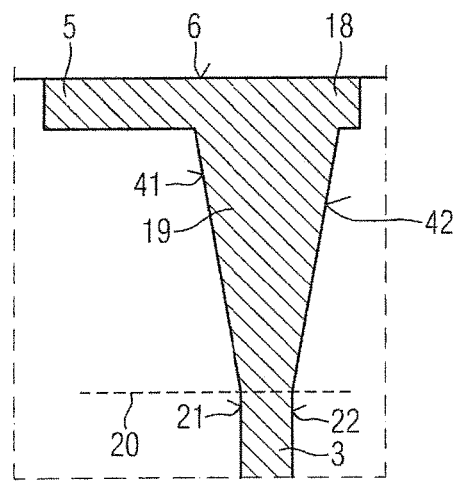

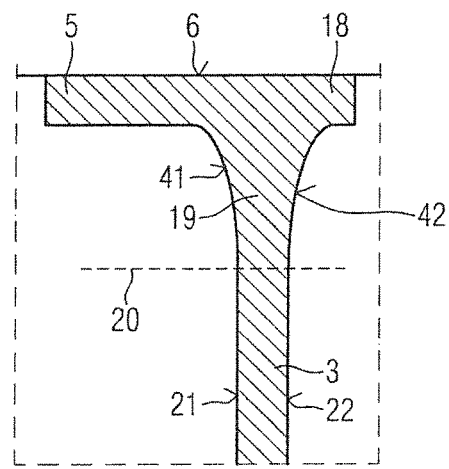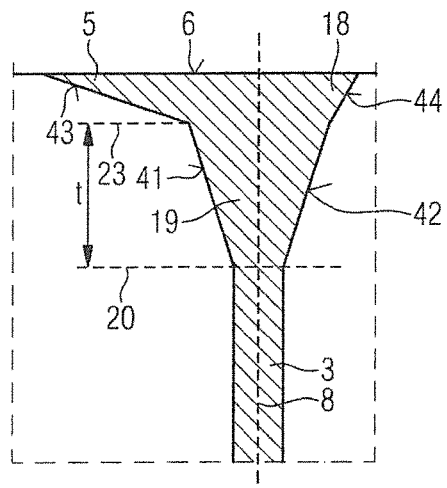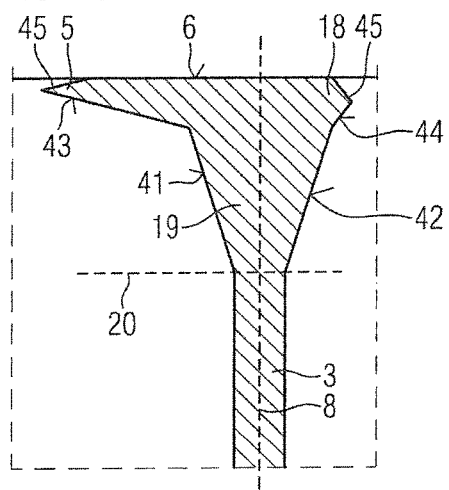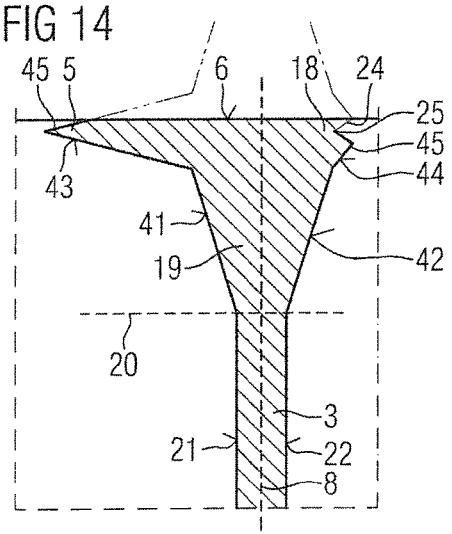

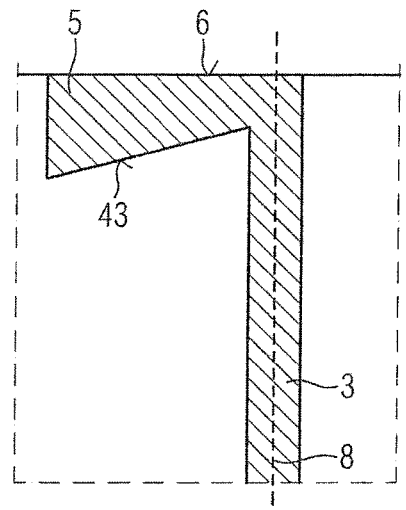
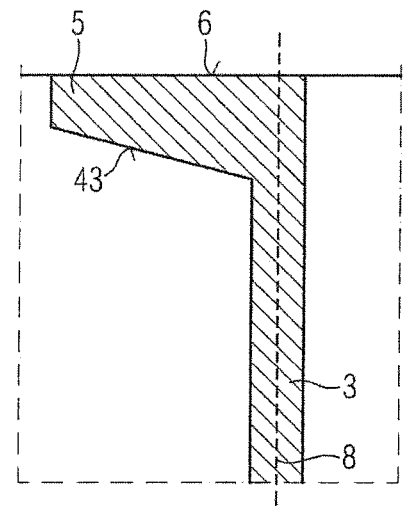
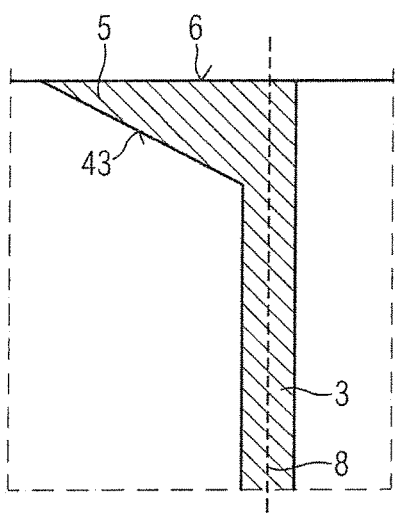
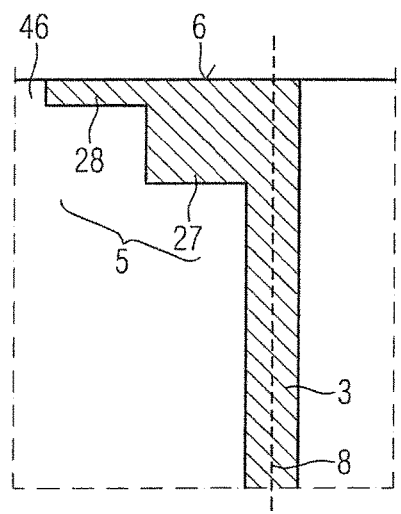

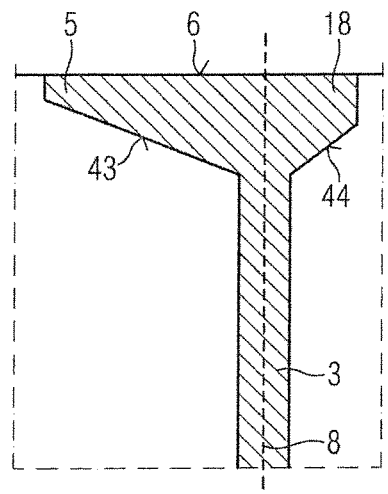
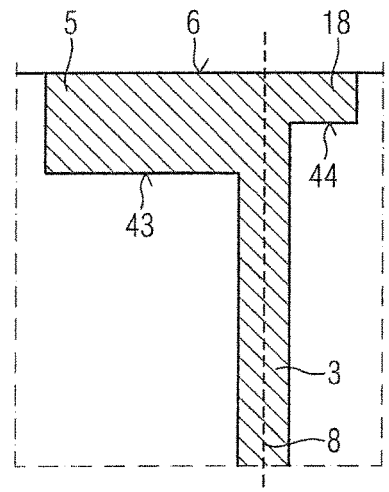
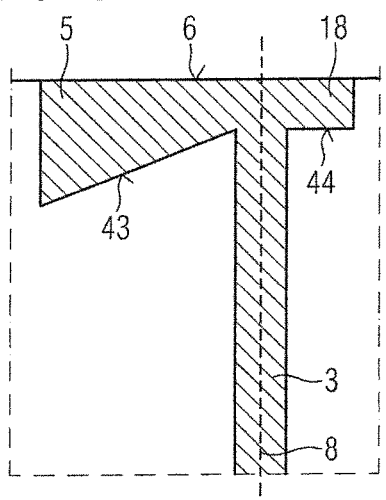
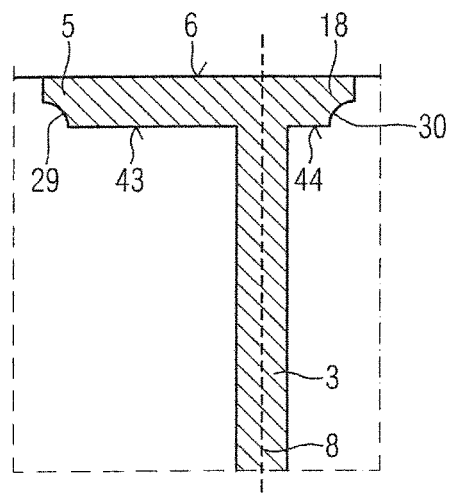

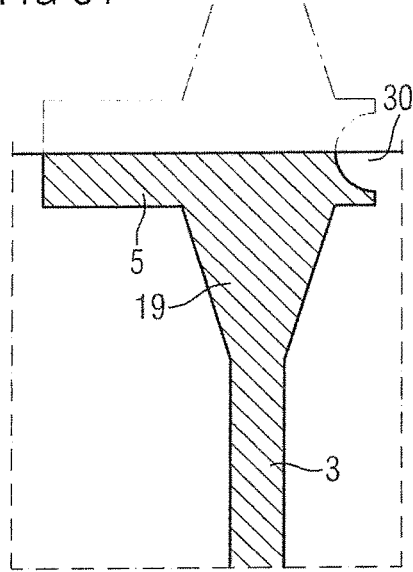
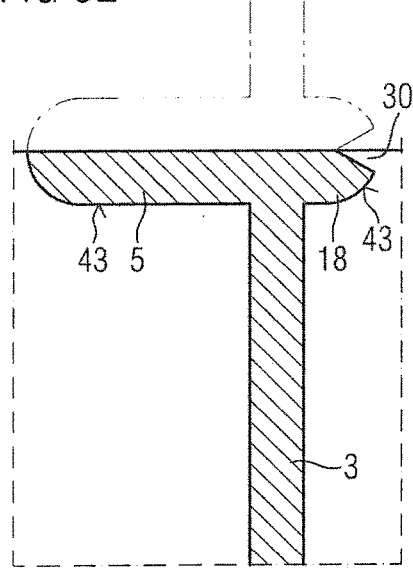
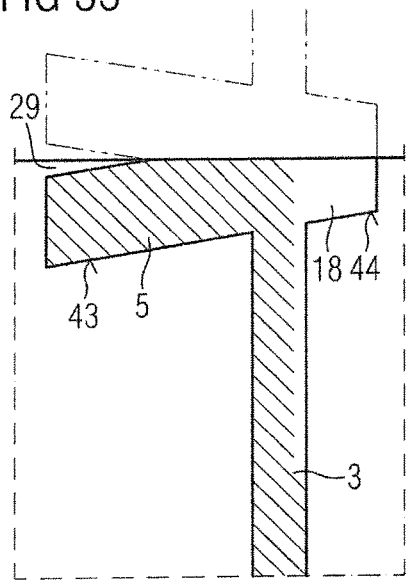

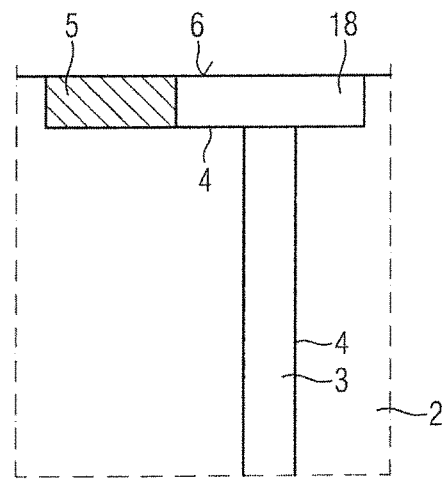
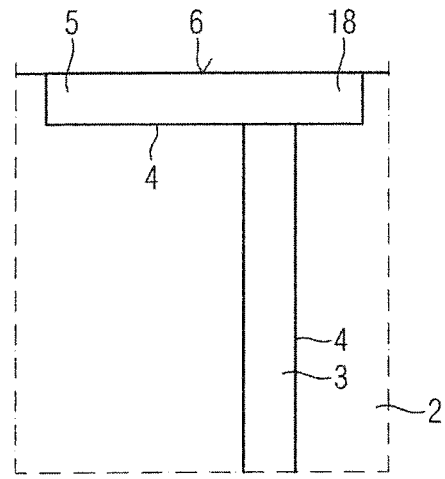
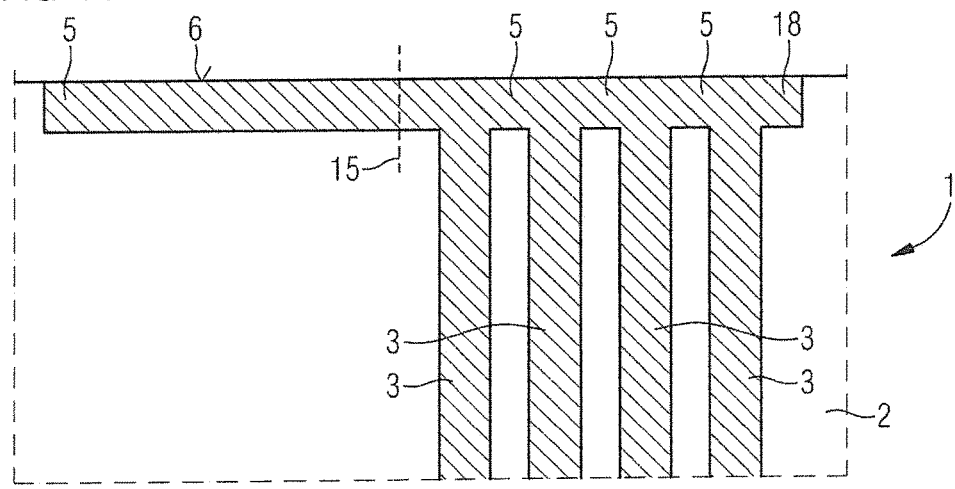

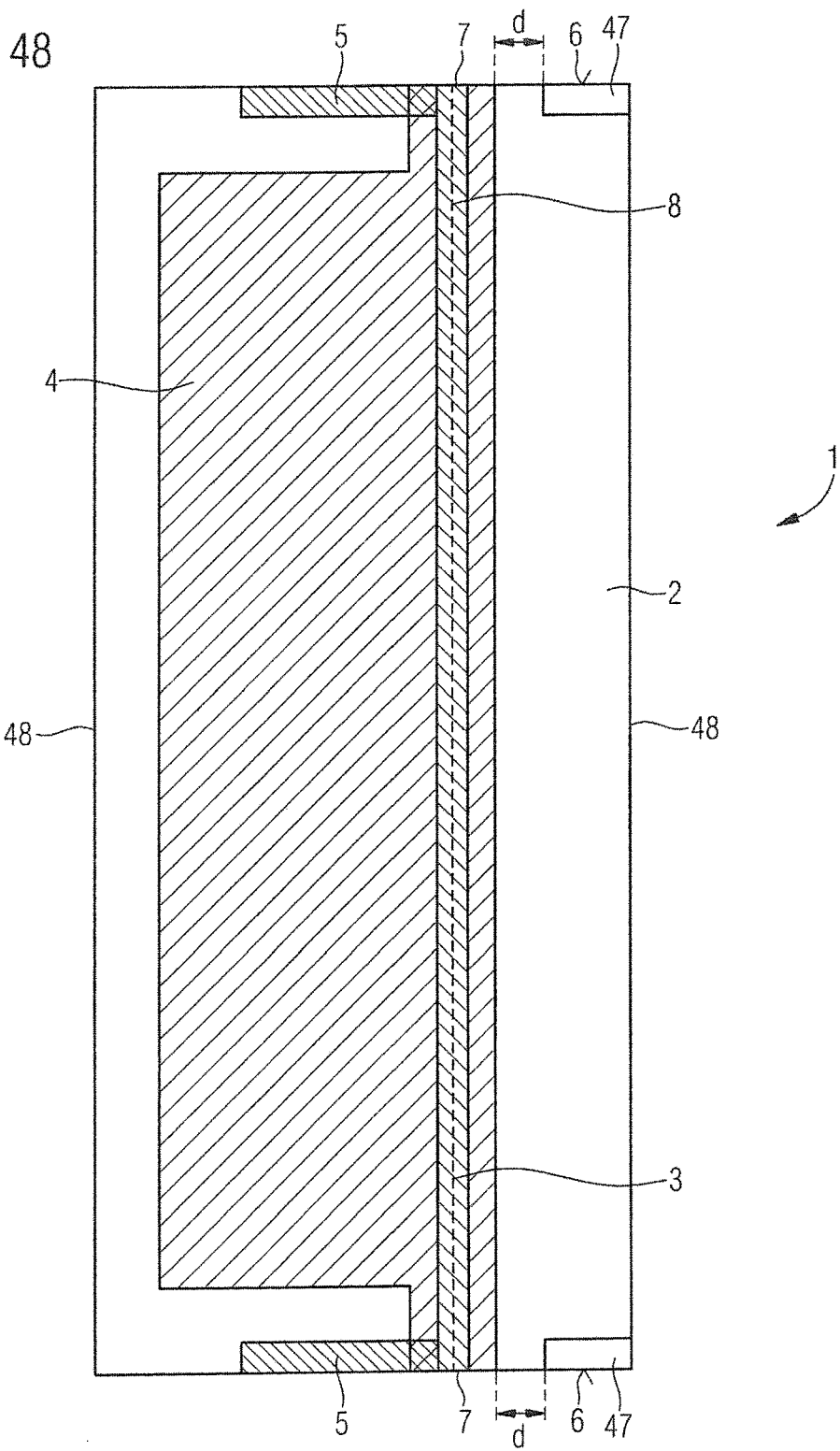

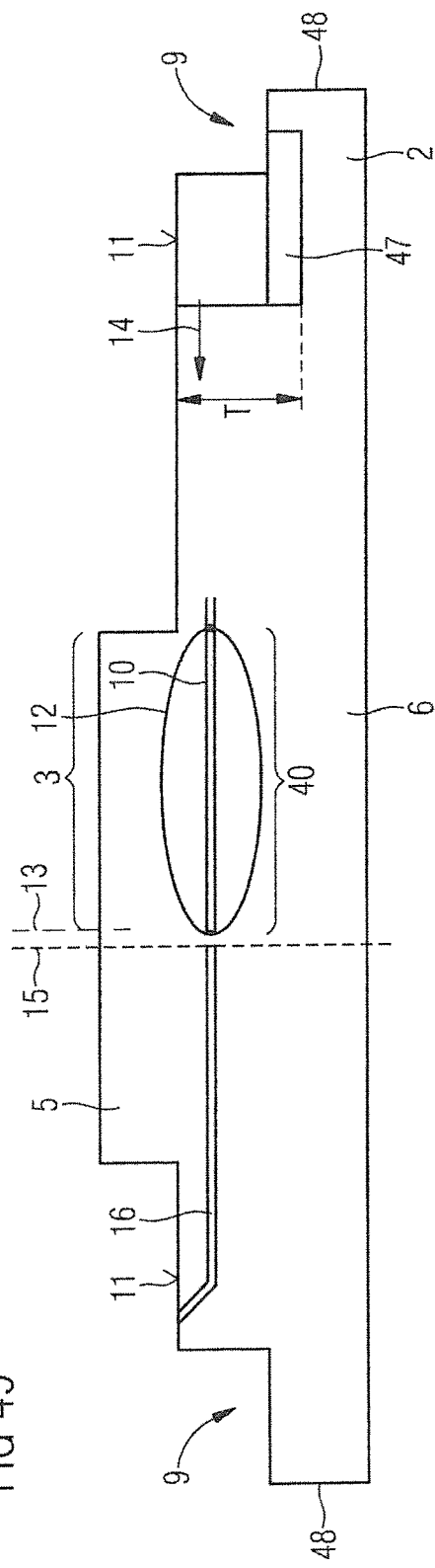

SEMICONDUCTOR LASER HAVING A RIDGE STRUCTURE WIDENED ON ONE SIDE

TECHNICAL FIELD

This disclosure relates to a semiconductor laser having a ridge structure widened on one side, a method of producing a semiconductor laser, and a wafer.

BACKGROUND

Semiconductor lasers comprising a main body having an optically active zone for generating electromagnetic radiation, wherein a ridge structure that guides the electromagnetic radiation is arranged on the main body are known. The ridge structure is oriented along a longitudinal axis and has a smaller width than the main body and the active zone. The semiconductor lasers are produced by a plurality of semiconductor lasers produced jointly on a main body. With the aid of a breaking method, the semiconductor lasers are broken off from the main body and singulated. The semiconductor laser thus has a fracture face at both end faces of the ridge structure. The fracture face is arranged transversely with respect to the longitudinal axis of the ridge structure. For a good quality of the semiconductor laser it is necessary that the fracture face constitutes a face that is as planar as possible. During the breaking of the fracture face it can happen that the fracture face, i.e., the end face of the semiconductor laser, in the region of the active zone below the ridge structure, has dislocations. The dislocations adversely affect the quality of the semiconductor laser.

Thus, it could be helpful to provide an improved semiconductor laser and an improved method of producing a semiconductor laser.

SUMMARY

We provide a semiconductor laser including a main body and a ridge structure arranged on the main body, the ridge structure being oriented along a longitudinal axis above an active zone, wherein the ridge structure has a first width, the ridge structure has two opposite end faces along the longitudinal axis, adjacent to at least one end face, the ridge structure has an end section arranged on one side with respect to a center axis of the ridge structure such that the ridge structure is widened on one side adjacent to the end face, and on an opposite side of the ridge structure relative to the end section a fracture trench is arranged adjacent to the end face and at a distance from the ridge structure in a surface of the main body.

We also provide a method of producing two semiconductor lasers, wherein a main body including an active zone and including a ridge structure is provided, the ridge structure is arranged along a longitudinal axis on the main body above the active zone, the ridge structure has an end section arranged on one side and is widened on one side, on an opposite side of the ridge structure relative to the end section a fracture trench is arranged at a distance from the ridge structure in a surface of the main body, and the main body and the ridge structure in a region of the end section arranged on one side are broken proceeding from the side of the fracture trench and through the fracture trench perpendicular to the longitudinal axis such that two semiconductor lasers comprising a ridge structure having an end section on one side with respect to a center axis of the ridge structure such that the ridge structure is widened on one side adjacent to the end face, and on an opposite side of the ridge structure relative to the end section a fracture trench is arranged adjacent to the end face and at a distance from the ridge structure in a surface of the main body.

We further provide a wafer including a main body and at least two ridge structures arranged on the main body and oriented parallel to one another and along longitudinal axes above an active zone, wherein the ridge structures each have a first width, the ridge structures each have at least one end section arranged on one side with respect to a center axis of the ridge structure such that the ridge structures are widened on one side, on an opposite side of the ridge structures relative to the end section a fracture trench is arranged at a distance from the ridge structure in a surface of the main body, and the end sections and the assigned fracture trenches are arranged on a straight line.

BRIEF DESCRIPTION OF THE DRAWINGS

FIG. 1 shows a schematic plan view of a semiconductor laser.

FIG. 2 shows a schematic view from the front of a side face of the semiconductor laser.

FIG. 3 shows a plan view of a partial section of FIG. 2.

FIG. 4 shows an arrangement comprising a plurality of semiconductor lasers as part of a wafer.

FIGS. 7 to 11 show various examples of end sections and ridge structures of a semiconductor laser.

FIGS. 12 to 17 show further examples of an end section of a semiconductor laser.

FIGS. 18 to 25 show further examples of end sections of a semiconductor laser.

FIGS. 26 and 27 show rounded end sections of a semiconductor laser.

FIGS. 28 to 33 show further examples of end sections of a semiconductor laser.

FIGS. 34 to 43 show end sections of a semiconductor laser with different shapes of the electrical contact layer.

FIGS. 44 to 46 show parts of end sections of semiconductor lasers comprising a plurality of ridge structures.

FIG. 48 shows a schematic plan view of a further example of a semiconductor laser.

FIG. 49 shows a schematic view from the front of a side face of the semiconductor laser in FIG. 48.

FIG. 50 shows a plan view of a partial section of FIG. 49.

LIST OF REFERENCE SIGNS

Figure 5:
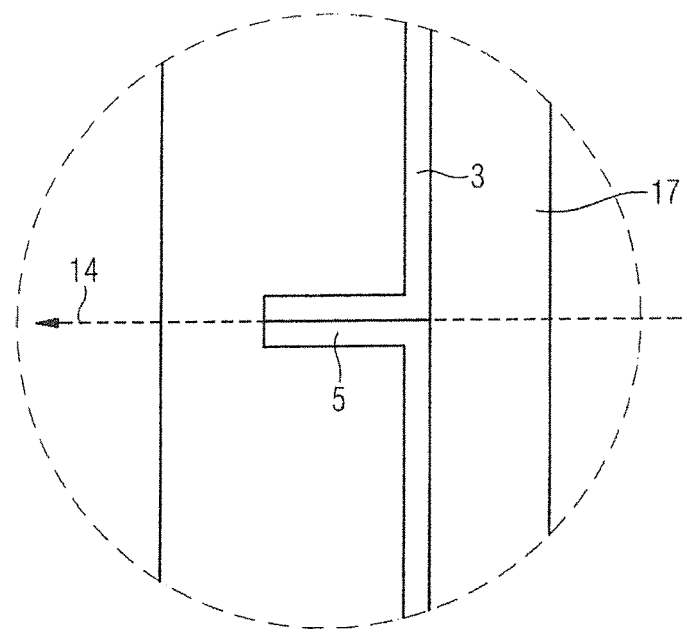
FIG. 5 shows an enlarged illustration of an excerpt from the arrangement in FIG. 4 with indication of the facet breaking direction.

1 Semiconductor laser
2 Main body
3 Ridge structure
4 Contact layer

5 End section
6 End face
7 Mirror layer
8 Center axis
9 Mesa trench
10 Active zone
11 Surface
12 Optical mode
13 Line
14 Arrow
15 Center
16 Transverse facet
17 Wafer
18 $2^{nd}$ end section
19 Taper structure
20 Transition line
21 $1^{st}$ side
22 $2^{nd}$ side
23 $2^{nd}$ transition line
24 Notch
25 Start plane
26 Distance
27 $1^{st}$ step
28 $2^{nd}$ step
29 $1^{st}$ indentation
30 $2^{nd}$ indentation
31 Delimiting face
33 Delimiting structure
40 Guidance region
41 $1^{st}$ side face
42 $2^{nd}$ side face
43 Further side face
44 Further $2^{nd}$ side face
45 Vertex
46 $3^{rd}$ step
47 Fracture trench
48 Side face
49 Predetermined separating line

DETAILED DESCRIPTION

One advantage of our semiconductor laser is that an end face of the semiconductor laser formed as a fracture face is arranged substantially in one plane. This is achieved by the ridge structure having an end section and widened on one side. Widening on one side by the end section achieves the effect, during breaking of the fracture face, that fewer or no dislocations or transverse fractures occur in the region of the optical mode within the ridge structure. As a result of the widened end section of the ridge structure, during breaking of the fracture face, dislocations or transverse fractures are formed only laterally alongside the ridge structure. As a result, the end face of the semiconductor laser is formed substantially as a planar fracture face. The optical quality of the end face is increased in this way. The end faces are provided with dielectric layers, for example, by which a reflectance of the mirror faces of 0.1 to 99% is achieved. The electromagnetic radiation generated by the active zone is scarcely or insignificantly adversely influenced by the plane end face.

As a result of a widening of the end section on one side, dislocations are produced only outside the optical mode during breaking of the semiconductor laser. Our experiments have shown that, during breaking, transverse dislocations of the fracture plane occur in the region of a center of the width of the ridge structure. As a result of widening of the ridge structure on one side in the end section, the center of the width of the ridge structure in the end section is shifted out of a region of the normal ridge structure. In addition, on an opposite side of the ridge structure relative to the end section a fracture trench is arranged adjacently to the end face and at a distance from the ridge structure in a surface of the main body. The fracture trench supports a defined formation of a fracture edge during singulation of the semiconductor lasers.

Consequently, lateral dislocations of the fracture plane running transversely with respect to the end face, i.e., transversely with respect to the breaking direction, are also shifted out of the region of the normal ridge structure outside the end section. Thus, dislocations of the fracture face are shifted out of the central region of the active zone in which the electromagnetic radiation is guided by the ridge structure. An improved formation of the end face of the semiconductor laser is thus achieved. In particular, disturbances of formation of the electromagnetic radiation that may be caused by a transverse offset in the region of the end face are reduced or avoided.

The fracture trench may be introduced into the surface with the aid of a mechanical scribing method, in particular with the aid of a diamond, or with the aid of a laser removal method. As a result, the fracture trench can be produced simply, rapidly and with sufficient accuracy.

The fracture trench may be introduced into the main body by a chemical etching method. A precise shape and position of the fracture trench can be produced in this way.

An end of the fracture trench facing the ridge structure may be at a distance of less than 300 µm, preferably less than 100 µm or particularly preferably less than 70 µm, from the ridge structure. A precise orientation of the fracture edge with respect to the end section can be achieved with the aid of these distances.

A width Y of the fracture trench perpendicular to the end face 6 may be less than 100 µm, in particular less than 50 µm, in particular less than 20 µm. This enables a sufficient guidance of the fracture edge in conjunction with fast production of the fracture trench.

A depth of the fracture trench perpendicular to the surface of the main body may be greater than 2 µm, in particular greater than 10 µm, in particular greater than a height of the ridge structure. These values provide a sufficient guidance of the fracture edge in conjunction with fast production with little damage to the main body.

A length of the widened end section along a center axis of the ridge structure as far as the end face may be less than 100 µm, or preferably less than 50 µm and particularly preferably less than 20 µm. A sufficient certainty for the guidance of the fracture edge is provided in this way.

The semiconductor laser may comprise a ridge structure having end sections arranged on one side at both end faces relative to the longitudinal extent. In this way, the probability of formation of a transverse offset in a central guidance region of the electromagnetic radiation along the ridge structure is avoided or reduced on both end faces. Consequently, both end faces have a better quality for a reflection or coupling-out of the guided electromagnetic radiation.

The two end sections may be arranged on a first longitudinal side of the ridge structure. In this way, both end faces can be broken from the same side. The end sections can also be arranged on opposite longitudinal sides of the ridge structure. However, this may require a more complex production method since the breaking direction may have to be changed during breaking of the end faces.

A width b1 of the first end section perpendicular to a center axis of the ridge structure may be greater than or equal to a sum of a width b2 of the second end section and a width of the ridge structure. This results in certain guidance of the fracture edge.

Radiation losses that might occur as a result of the end section may be reduced. For this purpose, the width of the ridge structure increases continuously from a normal width of the ridge structure up to a second width of the end section adjacent to the end face. As a result of the slow increase, propagation of the electromagnetic radiation is impaired as little as possible.

Radiation losses as a result of the end section may be moderated. This is achieved by the width of the end section increasing proceeding from the width of the ridge structure in at least one step, preferably in at least two steps, to the second width of the end section adjacent to the end face. Stepwise widening of the end section enables simple formation of the end section.

The electrical losses of the semiconductor laser may be reduced. This may be achieved by the ridge structure in the widened end being covered only partly by a contact layer. The contact layer is preferably formed along a center axis of the ridge structure in the end section. The contact layer can end before the end face at a defined distance from the end face on the ridge structure. Moreover, when a taper structure is provided, it is possible for lateral regions of the taper structure not to be covered with the contact layer. The reduction of the area of the contact layer reduces electrical losses that make no contribution to formation of the electromagnetic radiation.

The ridge structure may have a lateral indentation situated opposite relative to the side of the end section on one side, wherein the width of the ridge structure decreases in the direction of the end face starting from a defined distance from the end face. Formation of the indentation makes it possible, during breaking, to adjust the position of the fracture edge to a desired position with respect to the longitudinal axis of the ridge structure. The method of producing the semiconductor laser is improved in this way. In addition, the method is simplified since inaccuracies during the placement of the breaking tool with respect to an optimum breaking plane can be compensated for by formation of the lateral indentation of the ridge structure.

The ridge structure may have a taper structure adjacent to the end section arranged on one side, the taper structure being formed at least on one side with respect to a center axis of the ridge structure. The taper structure constitutes a widening of the ridge structure and reduces waveguide losses.

The end section arranged on one side may have a rounded side face. In particular, a rounded side face is formed in a transition region between the normal ridge structure and the widened end. Losses during the guidance of the electromagnetic radiation are reduced in this way.

An improved guidance of the electromagnetic radiation may be achieved by the end section being widened on one side increasing or decreasing in width with increasing distance from the center axis of the ridge structure.

Either an increase in width with increasing distance from the center axis of the ridge structure or a decrease in the width of the end section with increasing distance from the center of the ridge structure can be advantageous for the quality of the electromagnetic radiation.

Two ridge structures may be provided, which are arranged alongside one another and have a common, widened end section adjacent to a common end face. In this way, it is possible to provide semiconductor lasers comprising a plurality of ridge structures having an improved end face.

A delimiting structure may be provided at or before a widened end section, the delimiting structure bringing about a delimitation of the direction of propagation or propagation area of the electromagnetic radiation. An improvement of a far field of the electromagnetic radiation is achieved in this way. Particularly with the use of end sections arranged on one side for an improvement of the end face there is the risk of the emission characteristic of the electromagnetic radiation being adversely influenced, in particular expanded. The expansion and/or the disturbance of the modes of the electromagnetic radiation can be reduced or avoided by provision of corresponding delimiting structures.

A method of producing two semiconductor lasers uses a main body comprising an active zone and a ridge structure, wherein the ridge structure is arranged along a longitudinal axis on the main body above the active zone, wherein the ridge structure has an end section arranged on one side and is widened on one side, wherein on an opposite side of the ridge structure relative to the end section a fracture trench is arranged adjacent to the end face and at a distance from the ridge structure in a surface of the main body, wherein the fracture trench constitutes a cutout, wherein the main body and the ridge structure section in the region of the end section arranged on one side are broken proceeding from the side of the fracture trench and through the fracture trench perpendicular to the longitudinal axis such that two semiconductor lasers comprising a ridge structure having an end section on one side are obtained.

At least two ridge structures may be arranged parallel to one another on the main body, wherein each ridge structure has at least one end section, wherein each end section is assigned a fracture trench in the main body on an opposite side of the ridge structure, wherein the end sections and the fracture trenches are arranged on a straight line, wherein four semiconductor lasers are obtained by the main body being broken along the straight line.

A wafer comprises a main body and at least two ridge structures arranged on the main body and oriented parallel to one another and along longitudinal axes above an active zone, wherein the ridge structures each have a first width, wherein the ridge structures each have at least one end section arranged on one side with respect to a center axis of the ridge structure such that the ridge structures are widened on one side, wherein on an opposite side of the ridge structures relative to the end section in each case a fracture trench is arranged at a distance from the ridge structure in a surface of the main body, wherein the end sections and the assigned fracture trenches are arranged on a straight line. In this way, a multiplicity of semiconductor lasers can be produced simply and rapidly.

The above-described properties, features and advantages and the way in which they are achieved will become clearer and more clearly understood in association with the following description of the examples explained in greater detail in association with the drawings.

A basic concept consists of reducing or avoiding disturbances of the facet, i.e., disturbances of a plane end face of semiconductor lasers comprising ridge structures which can occur, for example, on account of strains of epitaxial layers and instances of strain being induced by edges of the ridge structure during breaking of the end faces.

During cleavage or breaking of semiconductor laser facets, there is the risk that the cleavage fracture will not run in an atomic plane, rather that steps and fragmentation, so-called transverse facets, will be formed. The steps and fragmentation impair the adhesion of the reflective layers applied to the facet after cleavage. This adversely affects component properties (COMD, ageing). Moreover, steps and fragmentation (transverse facets) alter the reflection properties of the laser facet, i.e., of the end face of the semiconductor laser, in an uncontrolled manner, as a result of which, e.g., the laser threshold and/or a laser transconductance are/is adversely influenced.

We found that transverse facets can occur to an increased extent in highly strained semiconductor layers. This is the case, for example, for indium- or aluminum-containing gallium nitride layers grown pseudomorphically in a strained fashion. Particularly, quantum films containing high levels of indium in blue to green emitting gallium-nitride-based semiconductor lasers are highly strained and thus susceptible to transverse facets arising during facet cleavage. Besides the strain resulting from different semiconductor materials, in addition geometrical discontinuities such as corners of mesa edges also produce a strain that can likewise lead to transverse facets arising during facet cleavage. In particular, it has been observed experimentally that ridge structures etched into the epitaxial layers induce transverse facets in the region of the quantum films below the ridge structure. We found that the probability of a transverse facet being produced during facet cleavage rises for wider ridge structures. We additionally found that wide ridge structures transverse facets arise laterally centrally below the ridge structure in the quantum film region and up to a next geometrical disturbance, e.g., a corner of a mesa trench propagates along the direction in which the facet is cleaved. Transverse facets thus occur precisely below the center of the ridge structure and thus in the light emitting region of the active zone of the semiconductor laser, in which the highest electric field strengths occur.

A description is given below of examples of semiconductor lasers suitable for reducing the probability of the occurrence of transverse facets in the region of the active zone below the ridge structure or completely avoiding the occurrence of transverse facets. The aim of the examples described is to shift the occurrence of transverse facets out of the region of the active zone below the ridge structure and move it into lateral regions outside the guidance region below the ridge structure. The solutions described are based on the insight that transverse facets originate laterally centrally with respect to the width of the ridge structure and propagate along the direction in which the facet is broken by a breaking blade. One basic concept for improving the quality of the semiconductor lasers thus consists of making the ridge structure wider in the region in which the semiconductor laser is broken compared to in an adjacent longitudinal region. As a result of the greater width of the ridge structure in the end section, the center of the widened end of the ridge structure lies laterally offset alongside the center axis of the rest of the longitudinal region of the ridge structure. Therefore, transverse facets occur only outside the guidance region of the ridge structure. The guidance region is defined by the width and longitudinal extent of the ridge structure outside the end section. Consequently, the transverse facets that occur are arranged in a manner laterally offset relative to the guidance region of the active zone, in which the highest electromagnetic field strengths of the electromagnetic radiation occur. Consequently, the quality of the electromagnetic radiation that can be generated by the semiconductor laser can be significantly improved.

One basic concept consists, then, of making an end section of the ridge structure so wide on one side with respect to a center axis of the ridge structure that a center of the end section is arranged outside a width region of the rest of the ridge structure. In addition, depending on the example chosen, on a side arranged opposite relative to the side of the end section, a smaller widening can be provided, e.g., to reduce a squint angle of the electromagnetic radiation in a far field. Furthermore, depending on the example chosen, a taper structure can be provided in the end region of the ridge structure, the taper structure reducing feedback losses of the electromagnetic radiation on account of the end section arranged on one side. In addition, the shape of the end section can be chosen such that a definition of the plane of the fracture facet is predefined during breaking. Furthermore, depending on the example chosen, efficiency of the semiconductor laser can be increased by a partial covering of the end section by the contact metalization. Devices that improves the far field of the electromagnetic radiation can additionally be provided.

The spatial separation of formation of a dislocation or of a transverse facet from a guidance region of the ridge structure in which high electromagnetic field strengths occur, results in a locally improved adhesion of the dielectric reflective layers in the guidance region. Consequently, reflectivity of the facet is not impaired by different facet angles. Both effects have a positive influence on the laser performance, i.e., the threshold, the transconductance and the ageing, and on a performance distribution. The solution described does not require any change in the sequence of the epitaxially deposited layer sequence and can thus be applied to existing structures of layer sequences of semiconductor lasers.

FIG. 1 shows, in a schematic illustration, a plan view of a semiconductor laser 1 comprising a main body 2 having an active zone and a ridge structure 3 arranged on the main body 2. The ridge structure 3 is oriented along a center axis 8. In addition, the ridge structure 3 has a widening 5 on one side in each case at the ends. In the example illustrated, the widening 5 is arranged on the same side with respect to the center axis 8 of the ridge structure 7 and oriented substantially perpendicular to the center axis 8. The end sections 5 consist of the same material as the ridge structure 3 and are preferably applied to the main body 2 at the same time as the ridge structure 3. Both the main body 2 and the ridge structure 3 and the end sections 5 are delimited at the end faces 6 by a facet, i.e., a broken end face. Depending on the example chosen, a mirror layer 7 composed of a dielectric material, for example, is applied in each case on the end faces 6 to set the reflectance at the end faces to a desired range. The end section 5 has at least a width perpendicular to the center axis 8 which is wider than the width of the ridge structure 3 perpendicular to the center axis 8. By the ridge structure 3, a guidance region in the active zone for the electromagnetic radiation is brought about below the ridge structure 3, wherein the guidance region is arranged parallel to the ridge structure 3 and has approximately the same width as the ridge structure 3. A contact layer 4 is provided, which covers the ridge structure 3 along the entire length and additionally laterally covers a part of the surface of the main body 2. The contact layer 4 can constitute a bond pad.

FIG. 2 shows a schematic view of a facet 6 of the semiconductor laser in FIG. 1. In this illustration, in opposite lateral edge regions a mesa trench 9 is introduced into the main body 2. The main body 2 comprises a layer sequence of a laser diode having an active zone 10 that generates electromagnetic radiation. The active zone 10 is arranged below the ridge structure 3 in the main body 2 and is illustrated schematically.

The ridge structure 3 constitutes a waveguide guidance and leads to formation of the guidance region 40 for optical modes 12 of the electromagnetic radiation generated by the active zone 10. The optical mode 12 is illustrated schematically in the form of an ellipse below the ridge structure 3. The guidance region extends over the width of the ridge structure 3. The end section 5 preferably has the same height as the ridge structure 3. In addition, the end section 5 preferably consists of the same material as the ridge structure 3 and is produced at the same time as the ridge structure 3 and by the same method. Since the end section 5 is very short relative to the longitudinal extent of the ridge structure 3, the end section 5 has no effect on the width of the guidance region 40. Consequently, the guidance region 40 has the width of the ridge structure 3 at the facet 6 as well. The active zone 10 can be in the form of a simple pn-layer or a quantum layer or a quantum well structure having different layer sequences. The end section 5 is illustrated alongside the ridge structure 3, a dashed line 13 indicating a boundary between the ridge structure 3 and the end section 5. The dashed line 13 shows the transition between the normal width of the ridge structure 3 and the end section 5. In addition, a breaking direction in which the facet 6 was broken was illustrated with the aid of an arrow 14 in FIG. 2. In the example illustrated, the breaking direction runs from right to left. Formation of the end section 5 results in a larger width of the ridge structure 3 in the plane of the facet 6 such that a center 15 of the ridge structure 3 is arranged in a manner laterally offset with respect to the guidance region 40 for the optical mode 12. The center 15 is depicted with the aid of a further dashed line. In addition, a transverse facet 16 is illustrated schematically at the facet 6. The transverse facet 16 originates during breaking at the center 15 in the region of the active zone 10 and runs laterally outward in the breaking direction, which is illustrated by an arrow 14. Shortly before reaching the mesa trench 9, the transverse facet 16 migrates upward into the surface 11 of the main body 2. As a result of the end section 5, the center 15, at which transverse facets 16 form, lies laterally offset with respect to the optical mode 12 and, therefore, does not disturb the optical and mechanical properties of the facet 6 in the guidance region 40 of the optical mode 12 of the electromagnetic radiation.

Above FIG. 2, FIG. 3 is illustrated, which shows a plan view of a partial section of the semiconductor laser 2 in FIG. 2. The ridge structure 3 has a width B perpendicular to a longitudinal extent of the ridge structure 3.

The end section 5 extends, proceeding from the ridge structure 3, as far as a predefined second width B2 perpendicular to the longitudinal extent of the ridge structure 3. In addition, the end section 5 is adjacent to the facet 6 and extends a defined length L parallel to the longitudinal extent of the ridge structure 3.

FIG. 4 shows an excerpt from a wafer 17 on which a plurality of semiconductor lasers 1 were produced in a continuous fashion. In this case, a ridge structure 3 extends over a plurality of semiconductor lasers 1. The semiconductor lasers 1 are formed in accordance with the example in FIG. 1. Between two semiconductor lasers 1, an end section 5 is formed as part of the ridge structure 3 laterally extending away from the ridge structure 3 from the longitudinal axis of the ridge structure 3. To singulate the semiconductor lasers 1, the wafer 17 is subdivided into segments, wherein the wafer 17 is broken perpendicular to the longitudinal extent of the ridge structure 3 in the region of the end sections 5.

FIG. 5 shows an enlarged illustration of an end section 5 in FIG. 4, the illustration of the contact layer having been dispensed with. An imaginary plane of the facet breaking direction is illustrated with the aid of the arrow 14.

Figure 6:
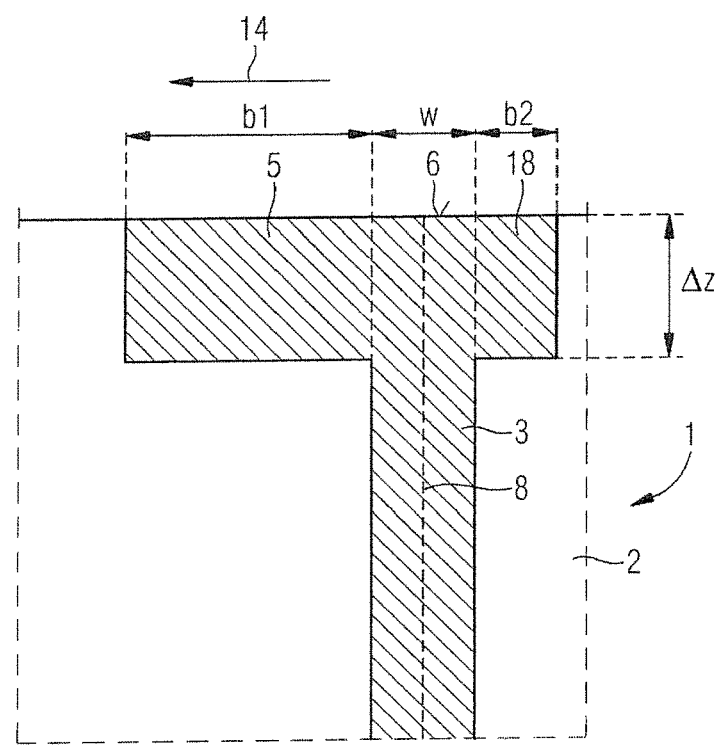
FIG. 6 shows a schematic illustration of an end section and of a ridge structure.

FIG. 6 shows, in a schematic illustration, an end region of a semiconductor laser 1 comprising a ridge structure 3 in accordance with FIG. 1, the illustration of the contact layer having been dispensed with. The ridge structure 3 has a width w perpendicular to a longitudinal extent of the ridge structure along a center axis 8. In addition, the ridge structure 3 has adjacently to the facet 6 a lateral end section 5 having a width b1 and a length $\Delta z$. The breaking direction to cleave the main body 2 and the ridge structure 3 is illustrated by the arrow 14. Furthermore, the ridge structure 3 has a second end section 18 arranged opposite relative to the end section 5 and has a width b2 and a length $\Delta z$. The following condition is preferably met so that a transverse facet is arranged in a manner laterally offset with respect to the optical mode: $b1 \geq w + b2$. Consequently, the ridge structure 3 adjacent to the facet 6 is made wider asymmetrically on one side, asymmetrically on the left-hand side in FIG. 6, than on the right-hand side. Depending on the example chosen, the second end section 18 can also be dispensed with.

Since an optical mode is typically somewhat wider than the ridge structure 3, preferably the end section 5 and the second end section 18 can be dimensioned such that the following condition is met: $b1 \geq w + 2\,\mu m + b2$.

For a further minimization of optical losses, the first and second end sections 5, 18 can be dimensioned such that the following condition is met: $b1 \geq w + 4\,\mu m + b2$. If the second end section 18 is dispensed with, the above conditions can be used without the width b2 for the second end section 18 to define the dimensioning of the end section 5.

As already explained above, the ridge structure 3 in an end region adjacent to the facet 6 on one side or on both sides can be made wider by an additional lateral end section 5, 18, i.e., can have an end section 5 on one side or additionally a second end section 18. An asymmetrically widened ridge structure 3 has a change in the ridge width in the direction of the optical beam propagation, i.e., in a longitudinal direction. In an asymmetrical widening, the wider end section is arranged on the side into which the fracture of the laser facet runs during cleavage of the facet. A longitudinal distance $\Delta z$ over which the end section 5 and/or the second end section 18 extend(s) has an effect on the optical distribution of the light below the ridge structure 3, which functions as a waveguide. The length of $\Delta z$ can be, for example, less than 100 µm, preferably less than 40 µm and particularly preferably less than 20 µm. In particular, the length of $\Delta z$ can advantageously be less than or equal to the Rayleigh length $z_R$. The Rayleigh length $z_R$ is calculated by $z_r = \Pi * w_0^2 * n / \lambda / M^2$, wherein $\Pi$ is the mathematical quantity pi, $\lambda$ is the wavelength in a vacuum or the emission wavelength of the laser, n is the refractive index of the material or the effective refractive index of the laser mode, $w_0$ is the beam waist or to a first approximation the ridge width, $M^2$ is the beam quality factor of the laser.

An asymmetrical widening of the ridge structure 3 can lead to an influencing of the radiation direction or to an expansion of the radiation angle of the electromagnetic radiation. Consequently, the electromagnetic radiation can leave the semiconductor laser partly at an angle of not equal to 90° with respect to the facet 6 and have a so-called squint angle in the far field. The squint angle results in an optical loss. To avoid or reduce the squint angle, it can be advantageous to provide the second end section 18 opposite relative to the end section 5, the second end section widening the ridge structure 3 opposite with respect to the side of the end section 5.

Depending on the example chosen, the width b2 of the second end section 18 can preferably be wide enough that the center of the ridge structure is situated adjacent to the facet 6 laterally with respect to the guidance region 40 and formation of the optical mode 12 is scarcely or not disturbed. By way of example, the width b2 of the second end section 18 can be less than twice the ridge width w or less than the ridge width alone. In particular, the following formula can hold true for the width b2 of the second end section 18: $b2 \leq 0.0227 \cdot \Delta z \cdot w$.

Preferably, the following formula can hold true for the width b2 of the second end section 18: $b2 \leq 0.0227 \cdot \Delta z \cdot w/2$.

For a further reduction of the waveguide losses produced by the provision of an end section 5, a taper structure can be provided in the transition between the ridge structure 3 and the end section 5 and/or the second end section 18. The taper structure constitutes a gradual widening of the ridge structure along the longitudinal extent of the ridge structure 3 preferably within a predefined propagation distance. In this case, side faces of the taper structure can be straight, exponentially curved, sinusoidal or cosinusoidal or bent. Furthermore, side faces of the taper structure can have a plurality of steps. In addition, side faces of the taper structure can have a combination of steps and curved/bent areas. One advantage of the taper structure is that a widened optical mode has a greater beam waist. As a result, the Rayleigh length increases and the waveguide loss decreases compared to a shorter Rayleigh length with an identical propagation distance.

FIGS. 7 to 11 show various shapes of taper structures 19 arranged in the transition region between a ridge structure 3 and an end section 5 and/or a second end section 18. The taper structure 19 is formed as part of the ridge structure 3 and preferably has the same height as the ridge structure 3. FIG. 7 shows a ridge structure 3 having adjacent to the facet 6 a widened end region having an end section 5 and a second end section 18. In addition, the ridge structure 3 transitions into a taper structure 19 starting from a transition line 20 in the direction of the facet 6. The taper structure 19 is in the form of a conical structure, wherein the diameter of the taper structure 19 widens continuously proceeding from the transition line 20 as far as the end section 5 and the second end section 18 on both sides 21, 22. Opposite side faces 41, 42 of the taper structure 19 are planar faces.

FIG. 8 shows a further example in which the ridge structure 3 has an end section 5 only on one side. In addition, only a taper structure 19 on one side is provided. The taper structure 19 on one side, over a first side face 41 proceeding from the transition line 20 in the direction of the end section 5, widens the width of the ridge structure 3 only on a first side 21 continuously with increasing distance from the transition line 20. The first side face 41 is a planar face.

FIG. 9 shows a further example substantially corresponding to the example in FIG. 7, but wherein, in addition, the second end section 18 projects from the conical taper structure 19 laterally via a step on a second side 22.

FIG. 10 shows a further example substantially corresponding to the example in FIG. 9, but wherein the transition line 20 is arranged further away from the end section 5 and the second end section 18. The transition line 20 can be at a distance from the end section 5 of, for example, more than 10 μm, preferably more than 40 μm, and particularly preferably more than 100 μm. The larger the distance t between the transition line 20 and the end section 5, i.e., the longer the taper structure 19, the lower the waveguide losses. In FIG. 10, too, the width of the taper structure 19, beginning at the transition line 20, increases continuously in the direction of the end section 5, as in FIG. 9.

FIG. 11 shows an example substantially corresponding to the example in FIG. 9, but wherein the taper structure 19 proceeding from the transition line 20 increases in width exponentially on both sides 21, 22 over curved side faces 41, 42 in the direction of the end section 5 and the second end section 18. The radii of curvature of the side faces 41, 42 can be constant or can change along the side faces 41, 42.

FIGS. 12 to 17 show further examples of semiconductor lasers 1 comprising ridge structures 3 having taper structures 19, wherein the end section 5 and/or the second end section 18 decrease(s) in length, i.e., in the extent parallel to a center axis 8 of the ridge structure 3, with increasing distance from the center axis 8 of the ridge structure 3. FIG. 12 shows an example substantially corresponding to the example in FIG. 9. The end section 5 has a further side face 43. The further side face 43 runs at an acute angle toward the facet 6. Moreover, the further side face 43 joins the first side face 41 of the taper structure 19 at a transition line 23 at a defined distance from the facet 6. The second end section 18 has a further second side face 44 which is a straight face. The further second side face 44 runs at an obtuse angle toward the facet 6. Moreover, the further second side face 44 joins the first side face 41 of the taper structure 19 at a transition line 23 at a defined distance from the facet 6. The length of the end section 5 and of the second end section 18, i.e., the extent parallel to the center axis 8 of the ridge structure 3, decreases with decreasing distance from the facet 6.

FIG. 13 shows an arrangement in accordance with FIG. 12, but wherein the end section 5 and the second end section 18 have a vertex 45 formed near the facet 6. The vertex 45 arose, for example, owing to the fact that during the breaking of the facet 6 the fracture plane was not situated exactly in the center relative to the end section 5 and the second end section 18.

FIG. 14 shows a further example in which the second end section 18 has alongside the vertex 45 a notch 24 in the direction of the center axis 8. The notch 24 can be used, for example, to predefine a start plane 25 for breaking the facet 6. If the notch 25 is not hit exactly during breaking, then a shape in accordance with FIG. 14 can arise.

Figure 15:
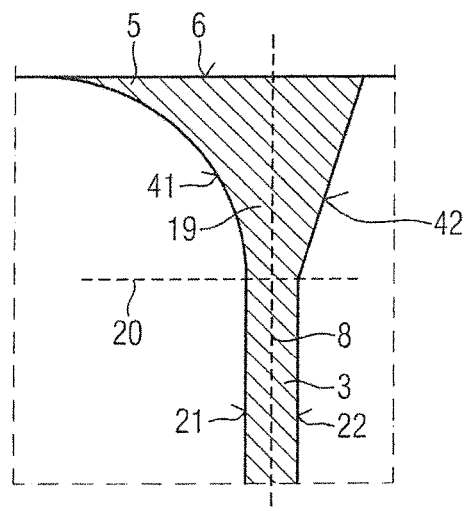

FIG. 15 shows a further example of a semiconductor laser comprising a ridge structure 3, wherein the taper structure 19, on a first side 21 of the ridge structure 3 having a rounded first side face 41, transitions into a rounded further side face 43 of the end section 5. The further side face 43 runs at an acute angle toward the facet 6. The taper structure 19 has a rectilinear second side face 42 on the second side 22 of the ridge structure 3. The second side face 42 runs in the direction of the facet 6 proceeding from the transition line 20, wherein the width of the ridge structure 3 increases continuously on the second side 22 relative to the center axis 8.

Figure 16:
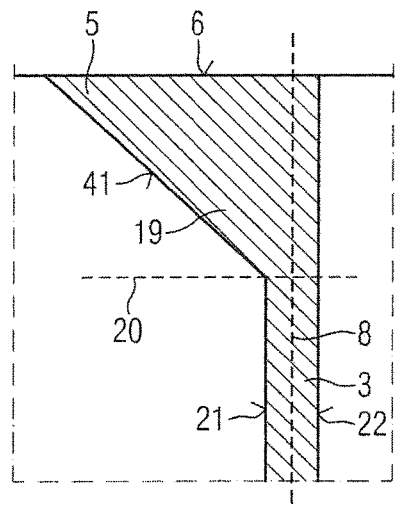

FIG. 16 shows a further example in which the taper structure 19 with the first side face 41 continuously increases the width of the ridge structure on one side on the first side 21 proceeding from the transition line 20 in the direction of the facet 6. In this example, the end section 5 is completely integrated into the taper structure 19.

Figure 17:
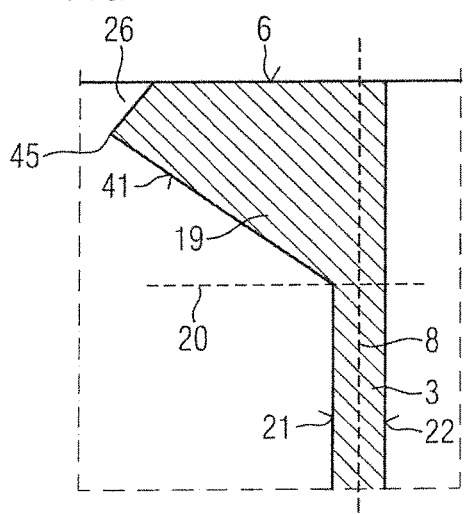

FIG. 17 shows an example formed substantially in accordance with the example in FIG. 16, but wherein the taper structure 19 has a vertex 45 and, starting from a distance 26 from the facet 6, decreases in width again continuously in the direction of the facet 6.

In the previous examples, widening of the ridge structure was formed approximately in a rectangular fashion. For a greater guidance of the fracture edge during breaking of the facet, widening of the ridge structure can also assume other shapes, which bring about an intensified effect of the widening as a result of alteration of the local strain distribution.

Figure 18:
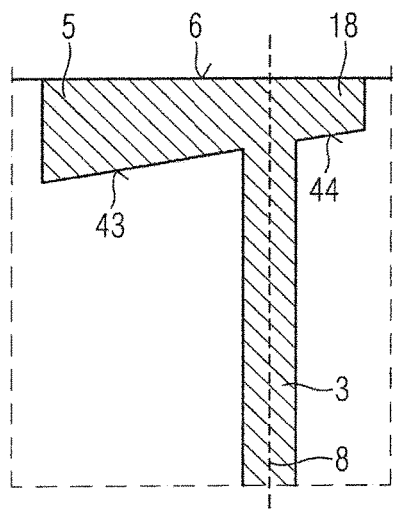

FIG. 18 shows an example of a semiconductor laser 1 comprising a ridge structure 3, an end section 5 and a second end section 18. The end section 5 has a further side face 43 arranged at an angle of less than 90 with respect to the center axis 8 of the ridge structure 3. Consequently, the extent of the end section 5 parallel to the center axis 8 of the ridge structure 3 increases with increasing distance from the center axis 8. The second end section 18 has a further second side face 44 arranged at an angle of greater than 90° with respect to the center axis 8 of the ridge structure 3. Consequently, the second end section 18 is formed such that the extent of the second end section 18 parallel to the center axis 8 decreases with increasing distance from the center axis 8.

FIG. 19 shows an example substantially corresponding to the example in FIG. 18, but wherein no second end section 18 is provided.

FIG. 20 shows an example in which the end section 5 has a further side face 43 arranged at an angle of greater than 90° with respect to the center axis 8 of the ridge structure 3. Consequently, the extent of the end section 5 parallel to the center axis 8 of the ridge structure 3 decreases with increasing distance from the center axis 8. The further side face 43 transitions into the facet 6 via a step.

FIG. 21 substantially corresponds to the example in FIG. 20, wherein the further side face 43 transitions into the facet 6 at an acute angle.

In FIG. 22, the further side face 43 of the end section 5 has two steps 27, 28. The end section 5 in FIG. 22 widens proceeding from the ridge structure 3 in a first step 27 to a first width and with decreasing distance from the facet 6 at a second distance with a second step 28 to a second width, larger than in the case of the first step 27. The further side face transitions into the facet 6 via a third step 46.

FIG. 23 shows an example of a semiconductor laser 1 comprising a ridge structure 3 having adjacent to the facet 6 an end section 5 on the first side 21 and a second end section 18 on the second side 22. The end section 5 has a further side face 43 arranged at an angle of greater than 90° with respect to the center axis 8 of the ridge structure 3. Consequently, the extent of the end section 5 parallel to the center axis 8 of the ridge structure 3 decreases with increasing distance from the center axis 8. The further side face 43 transitions into the facet 6 via a step. The second end section 18 has a further second side face 44 arranged at an angle of greater than 90° with respect to the center axis 8 of the ridge structure 3. Consequently, the second end section 18 is formed such that the extent of the second end section 18 parallel to the center axis 8 decreases with increasing distance from the center axis 8. Both the further side face 43 of the end section 5 and the further second side face 44 of the second end section 18 transition into the facet 6 via a step.

FIG. 24 shows an example in which the end section 5 and the second end section 18 are rectangles. The end section 5 has a larger longitudinal extent parallel to the center axis 8 of the ridge structure 3 than the second end section 18.

FIG. 25 shows an example substantially corresponding to the example in FIG. 18, but wherein the second end section 18 is a rectangle.

FIG. 26 shows a further example, wherein the end section 5 and the second end section 18 are rectangles and have an indentation 29, 30 in corner regions of the further side face 43 and of the further second side face 44, respectively. The indentation 29, 30 rounds off corner regions of the end section 5 and of the second end section 18 with a concave shape.

Figure 27:
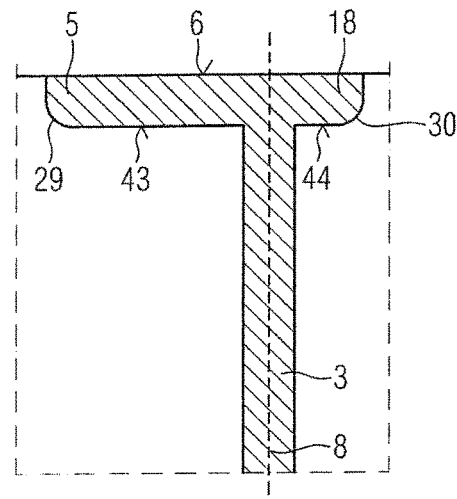

FIG. 27 shows a further example, wherein the end section 5 and the second end section 18 are rectangles and have an indentation 29, 30 in corner regions of the further side face 43 and of the further second side face 44, respectively. The indentation 29, 30 rounds off corner regions of the end section 5 and of the second end section 18 with a convex shape.

Figure 28:
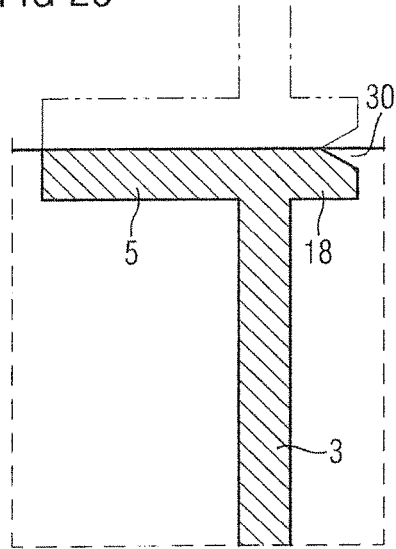

FIG. 28 shows a further example in which the first and second end sections are rectangular. The second end section 18 has a second indentation 30 adjacent to the facet 6. The second indentation 30 is provided to precisely predefine a start plane 25 during cleavage of the semiconductor lasers 1. The cleaved side is illustrated by dashed lines in FIG. 28. Prior to cleavage, the second indentation 30 is a tapering groove.

Figure 29:
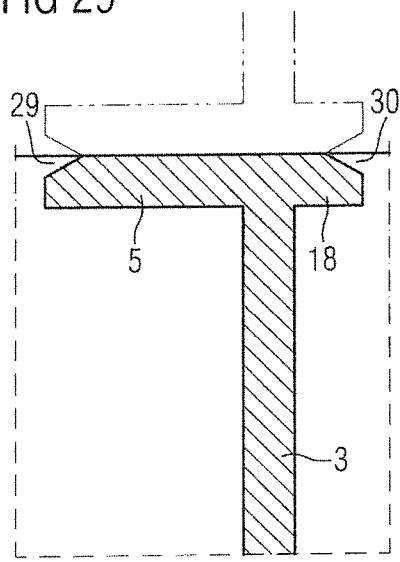

FIG. 29 shows a further example in which the first and second end sections are rectangular. In this example, the end section 5 also has a first indentation 29 adjacent to the facet 6. The cleaved side is illustrated by dashed lines in FIG. 29. Prior to cleavage, the first indentation 29 is a tapering groove.

Figure 30:
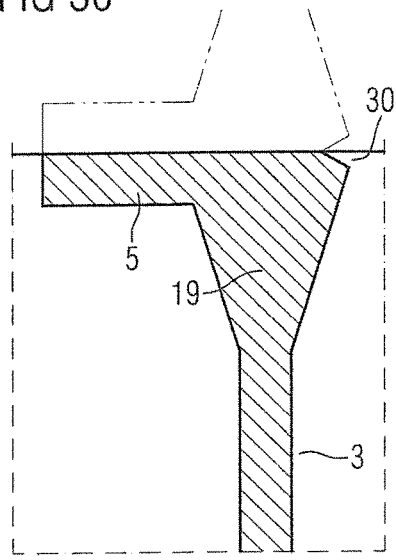

FIG. 30 shows an example comprising a taper structure 19 and an end section 5. In the taper structure 19, a second indentation 30 is provided opposite the end section 5 adjacent to the facet 6. The cleaved side is illustrated by dashed lines in FIG. 30. Prior to cleavage, the second indentation 30 is a tapering groove.

FIG. 31 shows an arrangement comprising a taper structure 19, an end section 5 and a second end section 18. The end section 5 and the second end section 18 are rectangular. The second end section 18 has a second indentation 30 adjacent to the facet 6. The second indentation 30 is provided to precisely predefine a start plane 25 during cleavage of the semiconductor lasers 1. The cleaved side is illustrated by dashed lines in FIG. 31. Prior to cleavage the second indentation 30 is a tapering groove.

FIG. 32 shows an example substantially in accordance with FIG. 28, but wherein the free edge of the further side face 43 of the end section 5 and of the further second side face 44 of the second end section 18 are rounded. The cleaved side is illustrated by dashed lines in FIG. 32. Prior to cleavage, the second indentation 30 is a tapering groove.

FIG. 33 shows a further example comprising a ridge structure 3, an end section 5 and a second end section 18. The further side face 43 of the end section 5 is arranged at an angle of less than 90° with respect to the center axis 8 of the ridge structure 3. In addition, the further second side face 44 of the second end section 18 is arranged parallel to the further side face 43 and preferably in an identical plane. In addition, the end section 5 has an indentation 29 adjacently to the facet 6. The cleaved side is illustrated by dashed lines in FIG. 33. Prior to cleavage, the indentation 29 is a tapering groove.

The indentations 29, 30 are, however, not led right into the guidance region 40 of the optical mode 12, but rather end laterally with respect thereto.

In addition, the end sections 5 and the second end sections 18 described can be in accordance with the conditions and formulae explained with reference to FIG. 6.

FIGS. 34 to 43 show various examples in which the contact layer is controlled in shape for various boundary conditions.

Figure 34:
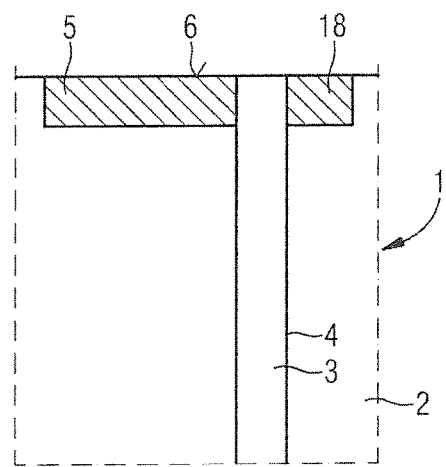

FIG. 34 shows a schematic illustration of a part of a semiconductor laser 1 comprising a ridge structure 3 having a rectangular end section 5 and a rectangular second end section 18. A contact layer 4 is applied on the ridge structure 3, the contact layer being led as far as the facet 6. Leakage currents are reduced as a result of the contact layer 4 being applied only in the region of the ridge structure 3.

Figure 35:
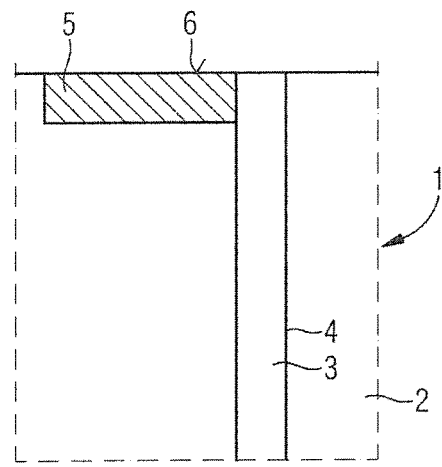

FIG. 35 shows a part of a further example of a semiconductor laser 1 in accordance with FIG. 34, but wherein only the end section 5 is provided and the second end section 18 has been dispensed with.

Figure 36:
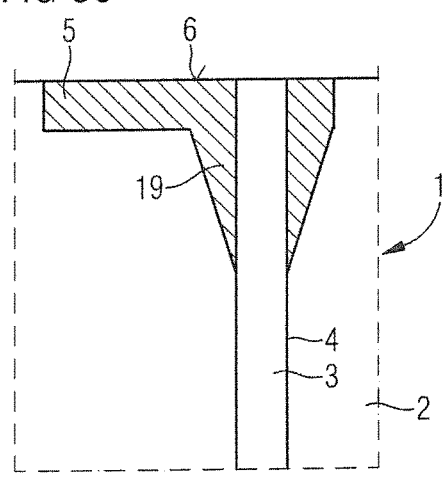

FIG. 36 shows a part of an example of a semiconductor laser 1 in accordance with the example in FIG. 9, wherein the contact layer 4 is arranged in the form of a rectangular strip with a constant width above the ridge structure 3, the taper structure 19 and the first and second end sections 5, 18 and is led as far as the facet 6. The contact layer 4 has the width of the ridge structure 3.

Figure 37:
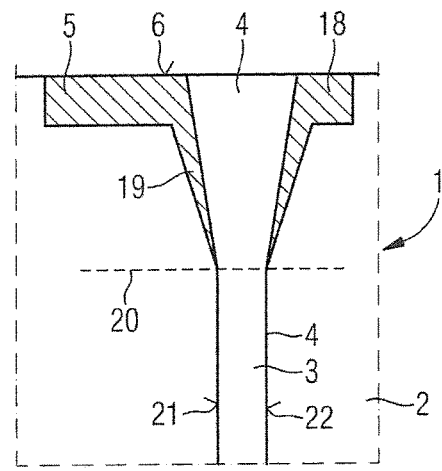

FIG. 37 shows a part of a further example of a semiconductor laser 1 substantially in accordance with FIG. 9, wherein the contact layer 4, beginning with the transition line 20, increases in width in the direction of the facet 6 conically on both sides 21, 22, but does not cover the entire width of the taper structure 19 which is conical.

Figure 38:
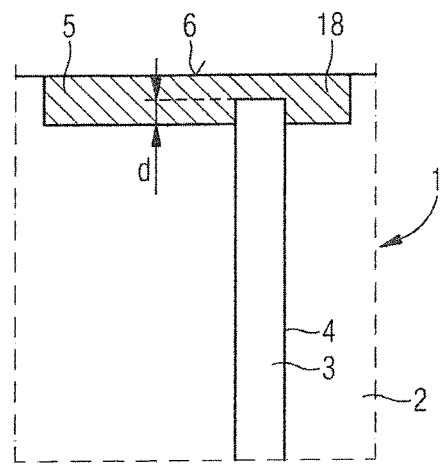

FIG. 38 shows a part of a further example of a semiconductor laser 1 substantially in accordance with FIG. 34, but wherein the contact layer 4 is not led as far as the facet 6 but rather ends at a defined distance d in the region of the end section 5 and the second end section 18. This example has a higher level (COD level) starting from which thermal destruction of the semiconductor laser takes place.

Figure 39:
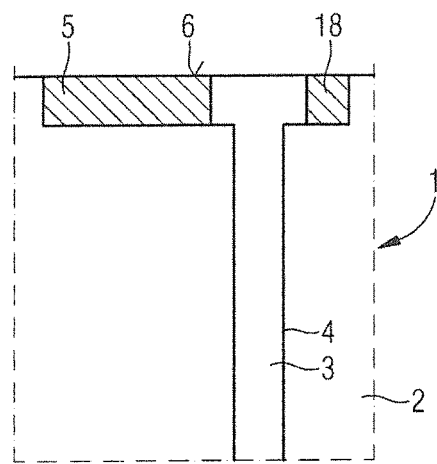

FIG. 39 shows a part of a further example of a semiconductor laser 1 substantially in accordance with FIG. 34, but wherein the contact layer 4, on both sides of the ridge structure 3 extends a predefined way in the direction of the end section 5 and the second end section 18.

Figure 40:
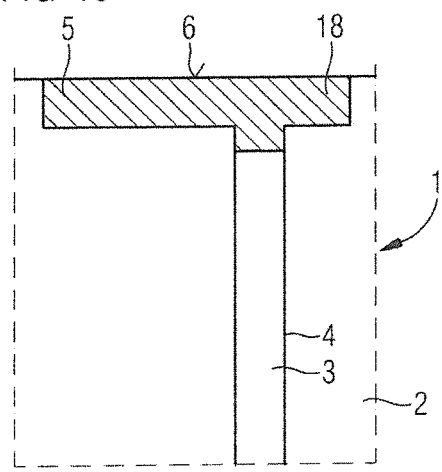

FIG. 40 shows a part of a further example of a semiconductor laser 1 substantially in accordance with the in FIG. 38, but wherein the contact layer 4 ends at a defined distance before the end section 5 and the second end section 18 on the ridge structure 3.

Figure 41:
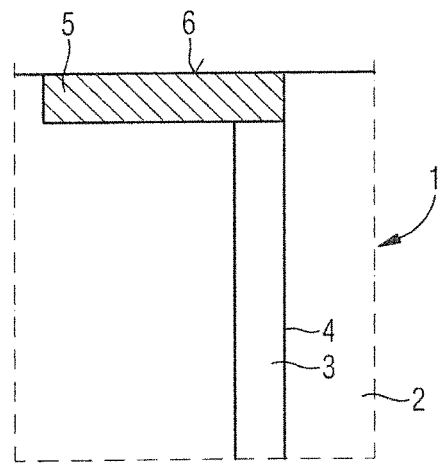

FIG. 41 shows a part of a further example of a semiconductor laser 1 substantially in accordance with FIG. 35, wherein the contact layer 32 ends at a defined distance from the facet 6 adjacently to the transition between the ridge structure 3 and the end section 5.

FIG. 42 shows a part of a further example of a semiconductor laser 1 substantially like FIG. 39, but wherein the entire second end section 18 is covered with the contact layer 4. In addition, mirror-symmetrically with respect to the center axis 8 of the ridge structure 3, the same part of the end section 5 is covered with the contact layer 4. The absorption in the region of the end section 5 and of the second end section 18 is reduced in this way.

FIG. 43 shows a part of a further example of a semiconductor laser 1 in which both the second end section 18 and the end section 5 are completely covered with the contact layer 4. Production can be carried out in a simple manner in the case of this example.

FIG. 44 shows a part of a further example of a semiconductor laser 1 in which a plurality of ridge structures 3 are arranged parallel to one another or alongside one another on a main body 2 having an active zone. The ridge structures are provided with a common end section 5 and a common second end section 18 in an end region. The widths in the region of the end section 5 and in the region of the second end section 18 are chosen such that the center 15, in the case of a breaking direction illustrated with the aid of the arrow 14, is arranged laterally alongside the guidance region 40 of the optical mode 12 of the last ridge structure 3 as seen in the breaking direction.

Figure 45:
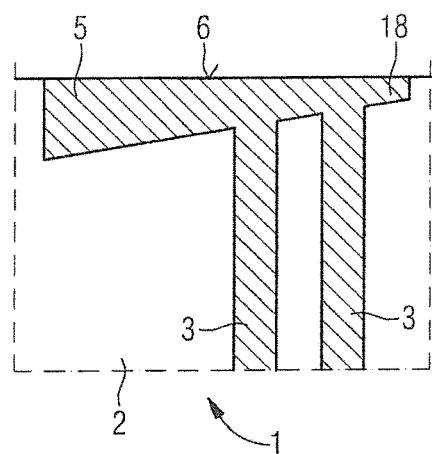

As illustrated schematically in FIG. 45, this arrangement can then be combined with all shapes for the taper structure 19 and the shapes for the end section 5 and the shapes for the second end section 18, as explained with reference to the previous figures. FIG. 45 shows an example in which the end section 5 and the second end section 18 are in accordance with FIG. 18.

Figure 46:
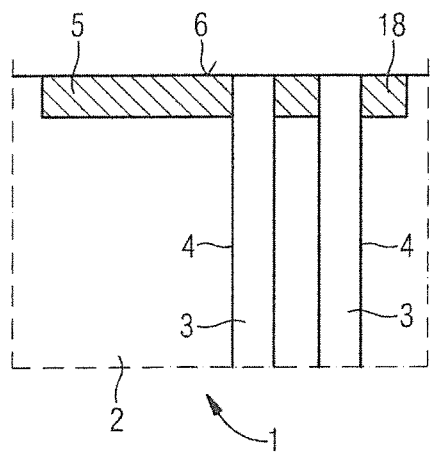

The contact layers are not illustrated explicitly in FIGS. 44 and 45. FIG. 46 shows an example of a semiconductor laser 1, wherein a contact layer 4 is applied on a ridge structure 3. The two contact layers 4 are electrically isolated from one another. Depending on the example chosen, the contact layers 4 of different ridge structures 3 can also be a continuous contact layer. The contact layer 4 can be in a wide variety of shapes in accordance with the examples explained depending on the desired example.

Figure 47:
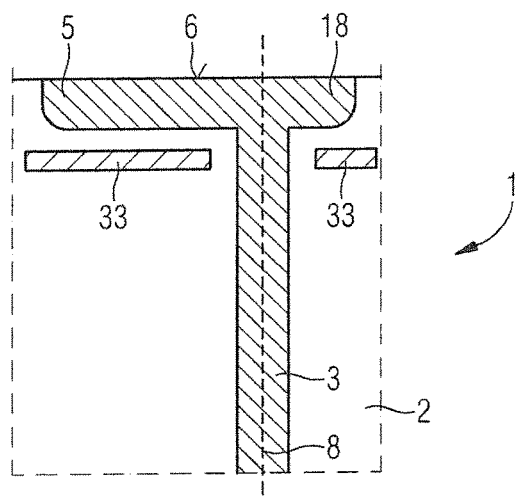
FIG. 47 shows, in a schematic illustration, an end section of a semiconductor laser with a device to delimit the modes of the electromagnetic radiation.

FIG. 47 shows, in a schematic illustration, a semiconductor laser 1 comprising a ridge structure 3 and an end section 5 and a second end section 18. In addition, a delimiting structure 33 is respectively provided in the transition region between the ridge structure 3 and the end section 5 and between the ridge structure and the second end section 18, the delimiting structure improving formation of the electromagnetic radiation in relation to a far field. Corresponding examples of delimiting structures are described, for example, in DE 10 2011 054 954 A1. The delimiting structure 33 can be combined with the various examples described in the text above.

FIG. 48 shows an example of a semiconductor laser 1 in accordance with FIG. 1, but wherein, on a side of the main body 2 arranged opposite with respect to the end section 5, a fracture trench 47 is formed in the surface 11 of the main body 2. The fracture trench 47 is introduced into the surface of the main body 2 at a defined distance d from the ridge structure 3 and adjacently to the respective end face 6. Depending on the example chosen, the fracture trench 47 can actually be adjacent to a side face 48 of the semiconductor laser 1. In addition, the fracture trench can be at a distance from the side face 48.

The fracture trench 47 can be introduced into the surface with the aid of a mechanical scribing method, in particular with the aid of a diamond, or with the aid of a laser removal method. In addition, the fracture trench 47 can be introduced into the surface 11 of the main body 2 by a chemical etching method.

The fracture trench 47 can be arranged such that an end of the fracture trench 47 facing the ridge structure 3 is at a distance d of less than 300 µm, preferably less than 100 µm, particularly preferably less than 70 µm, from the ridge structure 3. In addition, a width Y of the fracture trench 47 perpendicular to the end face 6 can be less than 100 µm, in particular less than in particular less than 20 µm. Furthermore, a depth T of the fracture trench 47 perpendicular to the surface 11 of the main body 2 can be greater than 2 µm, in particular greater than 10 µm, in particular greater than a height of the ridge structure 3 in the main body 2. These values for the depth T of the fracture trench 47 can also be provided in the region of the mesa trench 9. In addition, a length L of the widened end section 5, 18 along a center axis 8 of the ridge structure 3 as far as the end face 6 can be less than 100 µm or preferably less than 50 µm and particularly preferably less than 20 µm.

FIG. 49 shows a schematic side view of the semiconductor laser 1 in FIG. 1 with a view of the end face 6 and with a schematic illustration of the active zone 10, the optical mode 12 and the guidance region 40. A possible transverse facet 16 is additionally illustrated. In this example, the fracture trench 47 is introduced into the surface 11 of the main body 2 and into a surface of the mesa trench 9. FIG. 50 shows the plan view of an end region of the semiconductor laser 1 in FIG. 49. Only one end face 6 is illustrated here. Depending on the example shown, the fracture trench can be introduced only into the surface of the mesa trench 9. In addition, the fracture trench 47 can be led as far as the side face 48 of the semiconductor laser 1.

Figure 51:
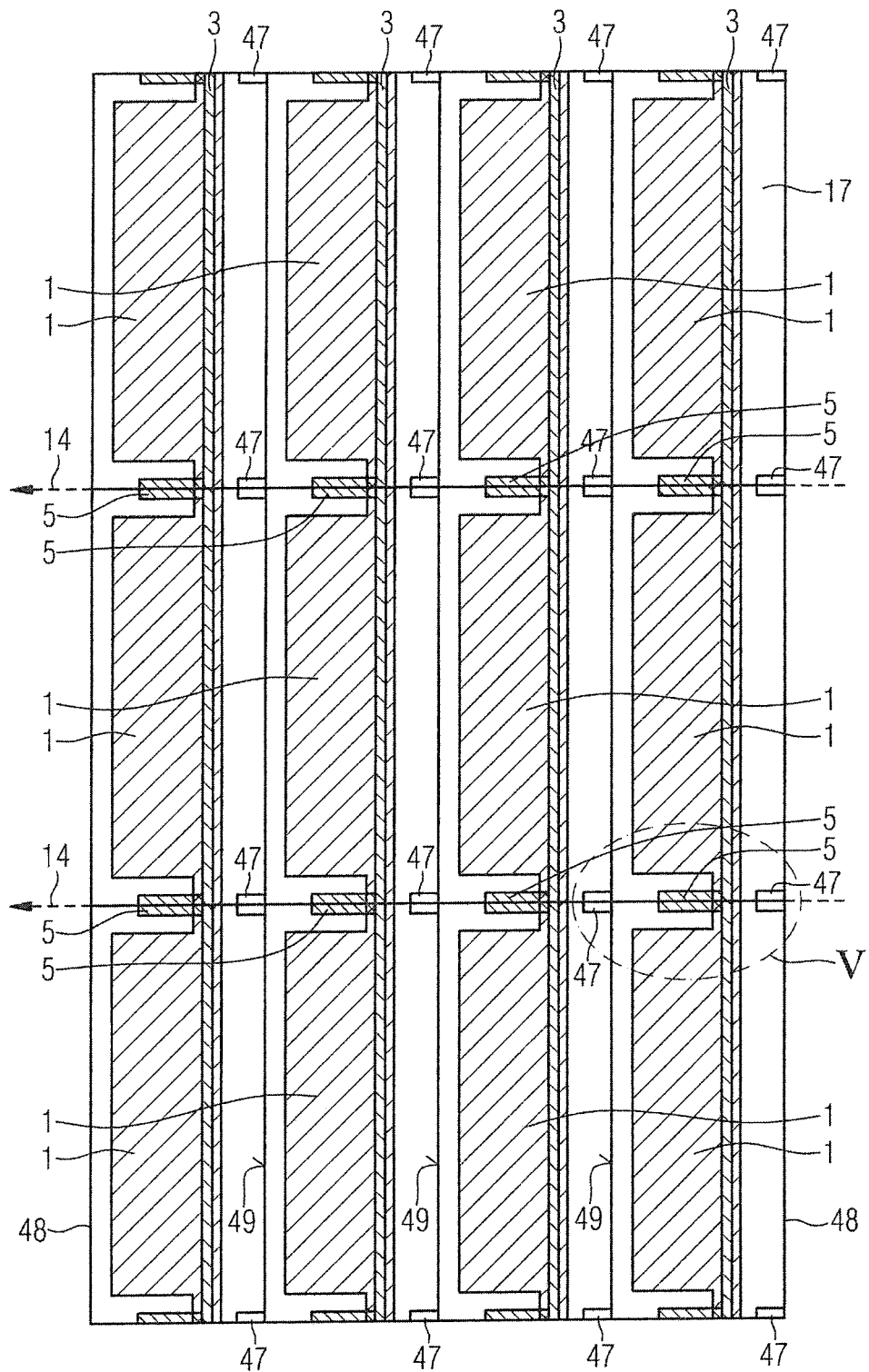
FIG. 51 shows an arrangement comprising a plurality of further semiconductor lasers as part of a wafer.

FIG. 51 shows an excerpt from a wafer 17 on which a plurality of semiconductor lasers 1 were continuously produced. In this case, a ridge structure 3 extends over a plurality of semiconductor lasers 1. In addition, a plurality of series of ridge structures 3 are illustrated alongside one another. Predetermined separating lines 49 are illustrated between the series. The semiconductor lasers 1 are in accordance with the example in FIGS. 48 to 50. A fracture trench 47 is provided for each end section 5. The end sections 5 and the fracture trenches 47 are arranged on a line. In addition, the fracture trenches 47 are adjacent to the predetermined separating lines 49 and to the side faces 48. Between two semiconductor lasers 1, an end section 5 is formed as part of the ridge structure 3 extending away from the ridge structure 3 laterally from the longitudinal axis of the ridge structure 3. To singulate the semiconductor lasers 1, the wafer 17 is subdivided into segments, wherein the wafer 17 is broken perpendicularly to the longitudinal extent of the ridge structure 3 in the region of the fracture trenches 47 and in the region of the end sections 5. The breaking direction is illustrated in the form of an arrow 14 and runs from right to left in the example illustrated. Provision of the fracture trenches 47 enables the fracture edge to be guided more accurately even over a longer distance.

Figure 52:
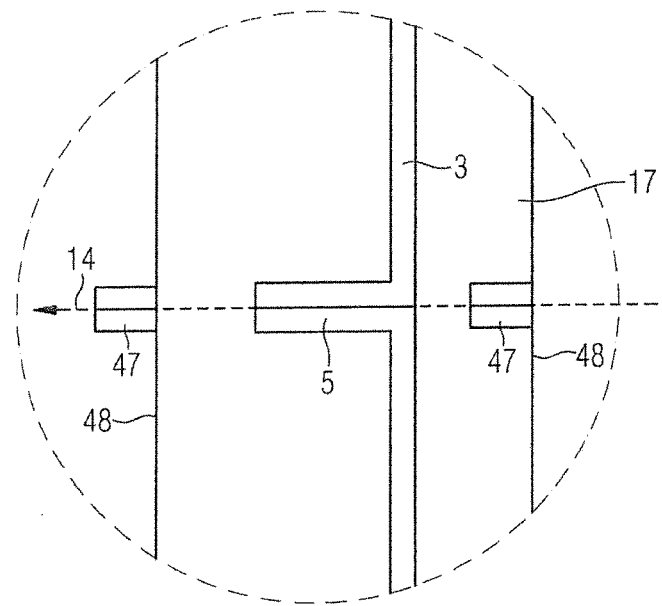
FIG. 52 shows an enlarged illustration of an excerpt from the arrangement in FIG. 51 with indication of the facet breaking direction.

FIG. 52 shows an enlarged illustration of an end section 5 in FIG. 51, the illustration of the contact layer having been dispensed with. An imaginary plane of the facet breaking direction is illustrated with the aid of the arrow 14.

Figure 53:
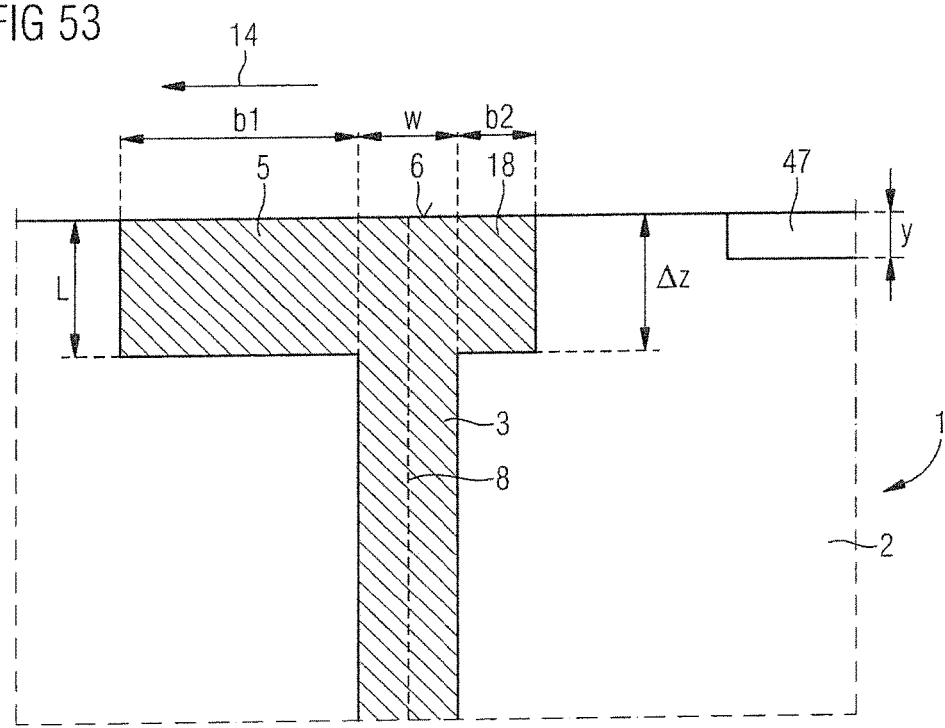
FIG. 53 shows a schematic illustration of an end section and of a ridge structure.

FIG. 53 shows, in a schematic illustration, an end region of a semiconductor laser 1 comprising a ridge structure 3 in accordance with FIG. 48, the illustration of the contact layer having been dispensed with. The ridge structure 3 has a width w perpendicular to a longitudinal extent of the ridge structure along a center axis 8. In addition, the ridge structure 3 has adjacently to the facet 6 a lateral end section 5 having a width b1 and a length Δz. The breaking direction to cleave the main body 2 and the ridge structure 3 is illustrated by the arrow 14. Furthermore, the ridge structure 3 has a second end section 18 arranged opposite relative to the end section 5 and has a width b2 and a length Δz. The following condition is preferably met so that a transverse facet is arranged in a manner laterally offset with respect to the optical mode: b1≥w+b2. Therefore, adjacently to the facet 6, the ridge structure 3 is made wider asymmetrically on one side, in FIG. 53 asymmetrically on the left side, than on the right side. Depending on the example chosen, the second end section 18 can also be dispensed with. Since an optical mode is typically somewhat wider than the ridge structure 3, the end section 5 and the second end section 18 can preferably be dimensioned such that the following condition is met: b1≥w+2 μm+b2. In addition, a width Y of the fracture trench 47 perpendicular to the end face 6 can be less than 100 μm, in particular less than 50 μm, in particular less than 20 μm.

The arrangement of the fracture trench(es) 47 can be provided in any example in FIGS. 7 to 47.

Although our lasers and methods have been more specifically illustrated and described in detail by the preferred examples, nevertheless this disclosure is not restricted by the examples disclosed, and other variations can be derived therefrom by those skilled in the art without departing from the scope of protection of the disclosure.

The main body 2 and the ridge structure 3 comprise, for example, a semiconductor layer sequence based on a III-V compound semiconductor material. The semiconductor material is, for example, a nitride compound semiconductor material such as aluminum$_n$-indium$_{1-n-m}$-gallium$_m$ nitride or a phosphide compound semiconductor material such as aluminum$_n$-indium$_{1-n-m}$-gallium$_m$ phosphide or else an arsenide compound semiconductor material such as aluminum$_n$-indium$_{1-n-m}$-gallium$_m$ arsenide, wherein n and m meet the following conditions: 0≤n≤1, 0≤m≤1 and n+m≤1. In this case, the semiconductor layer sequence can comprise dopants and additional constituents. For the sake of simplicity, however, only the essential constituents of the crystal lattice of the semiconductor layer sequence, that is to say aluminum, arsenic, gallium, indium, nitrogen and phosphorus, are indicated, even if they can be replaced and/or supplemented in part by small amounts of further substances.

The semiconductor layer sequence of the main body 2 comprises at least one active layer designed to generate electromagnetic radiation. The active layer comprises, in particular, at least one pn junction or, preferably, one or a plurality of quantum well structures. Electromagnetic radiation generated by the active layer during operation is, in particular, in the spectral range of 380 nm to 550 nm or 420 nm to 540 nm.

The semiconductor layers are deposited, for example, on a wafer with the aid of an epitaxial growth method. End-side end faces of the semiconductor lasers are produced by cleaving the semiconductor material, in particular the ridge structure and the main structure.

In addition, a light blocking layer can be applied on the mirror layers 7 as a delimiting structure 33, the light blocking layer delimiting an aperture angle for emission of the electromagnetic radiation. In this way, formation of the far field of the electromagnetic radiation is delimited and thus influenced positively.

This application claims priority of DE 10 2013 220 641.0, the subject matter of which is incorporated herein by reference.

The invention claimed is:

1. A semiconductor laser comprising a main body and a ridge structure arranged on the main body, said ridge structure being oriented along a longitudinal axis above an active zone, wherein
   the ridge structure has a first width,
   the ridge structure has two opposite end faces along the longitudinal axis,
   adjacent to at least one end face, the ridge structure has an end section arranged on one side with respect to a center axis of the ridge structure such that the ridge structure is asymmetrically widened with respect to the center axis on one side adjacent to the end face, and
   on an opposite side of the ridge structure relative to the end section a fracture trench is arranged adjacent to the end face and at a distance from the ridge structure in a surface of the main body, wherein the fracture trench is arranged on the same surface of the main body as the ridge structure.

2. The semiconductor laser as claimed in claim 1, wherein the fracture trench is introduced into the surface with the aid of a mechanical scribing method, a diamond, or a laser removal method or wherein the fracture trench is introduced into the main body by a chemical etching method or, wherein an end of the fracture trench facing the ridge structure is at a distance of less than 300 µm from the ridge structure.

3. The semiconductor laser as claimed in claim 1, wherein a width (Y) of the fracture trench perpendicular to the end face is less than 100 µm.

4. The semiconductor laser as claimed in claim 1, wherein a depth of the fracture trench perpendicular to the surface of the main body is greater than 2 µm.

5. The semiconductor laser as claimed in claim 1, wherein a length of the widened end section along a center axis of the ridge structure as far as the end face is less than 100 µm.

6. The semiconductor laser as claimed in claim 1, wherein the ridge structure has a second end section on one side at a second end relative to a center axis of the ridge structure such that the ridge structure is widened on one side adjacently to a second end face, and both end sections are arranged on a first longitudinal side of the ridge structure.

7. The semiconductor laser as claimed in claim 1, wherein a width of the first end section perpendicular to a center axis of the ridge structure is greater than or equal to a sum of a width of the second end section and a width of the ridge structure.

8. The semiconductor laser as claimed in claim 1, wherein a width of the end section proceeding from a defined distance from the end face in a direction of the end face increases continuously from a first width of the ridge structure up to a second width of the end section, and/or wherein a width of the end section proceeding from a defined distance from the end face in the direction of the end face increases from a first width of the ridge structure up to a second width of the end section in the direction of the end face at least in one step.

9. The semiconductor laser as claimed in claim 1, wherein a contact layer is applied on the ridge structure, the contact layer covering the ridge structure in an end region only in a partial region.

10. The semiconductor laser as claimed in claim 1, wherein the ridge structure has an indentation adjacent to an end face on a side situated opposite relative to the side of the end section such that the width of the ridge structure on this side in the region of the indentation decreases again in a direction of the end face.

11. The semiconductor laser as claimed in claim 1, wherein the ridge structure has adjacent to the end section at least one taper structure on one side with respect to the center axis of the ridge structure and in which the width of the ridge structure widens in a direction of the end section.

12. The semiconductor laser as claimed in claim 1, wherein the end section has a rounded side face along the longitudinal axis of the ridge structure or wherein the end section increases or decreases in width in the direction of the end face.

13. The semiconductor laser as claimed in claim 1, wherein at least one second ridge structure is provided, the two ridge structures are arranged alongside one another, the second ridge structure has a second end section, and the end sections and the ridge structures are integrally formed.

14. The semiconductor laser as claimed in claim 1, wherein a delimiting structure that delimits modes of the electromagnetic radiation is provided before the end section.

15. A method of producing two semiconductor lasers, wherein a main body comprising an active zone and comprising a ridge structure is provided, the ridge structure is arranged along a longitudinal axis on a surface of the main body above the active zone, the ridge structure has an end section arranged on one side and is asymmetrically widened with respect to the center axis on one side, on an opposite side of the ridge structure relative to the end section a fracture trench is arranged at a distance from the ridge structure in the same surface of the main body as the ridge structure, and the main body and the ridge structure in a region of the end section arranged on one side are broken proceeding from the side of the fracture trench and through the fracture trench perpendicular to the longitudinal axis such that two semiconductor lasers as claimed in claim 1 are obtained.

16. A wafer comprising a main body and at least two ridge structures arranged on the main body and oriented parallel to one another and along longitudinal axes above an active zone, wherein
the ridge structures each have a first width,
the ridge structures each have at least one end section arranged on one side with respect to a center axis of the ridge structure such that the ridge structures are asymmetrically widened with respect to the center axis on one side,
on an opposite side of the ridge structures relative to the end section a fracture trench is arranged at a distance from the ridge structure in a surface of the main body,
the end sections and the assigned fracture trenches are arranged on a straight line, and
the fracture trenches are arranged on the same surface of the main body as the ridge structures.

* * * * *